(12) United States Patent
Joo et al.

(10) Patent No.: US 9,779,833 B2
(45) Date of Patent: Oct. 3, 2017

(54) FLASH MEMORY DEVICE REVISING PROGRAM VOLTAGE, THREE-DIMENSIONAL MEMORY DEVICE, MEMORY SYSTEM INCLUDING THE MEMORY DEVICE, AND METHODS OF PROGRAMMING THE MEMORY DEVICE

(71) Applicant: SAMSUNG ELECTRONICS CO., LTD., Suwon-si, Gyeonggi-do (KR)

(72) Inventors: Sang-Hyun Joo, Suwon-si (KR); Jae-Woo Im, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/291,676

(22) Filed: Oct. 12, 2016

(65) Prior Publication Data
US 2017/0206978 A1 Jul. 20, 2017

(30) Foreign Application Priority Data

Jan. 15, 2016 (KR) .......................... 10-2016-0005318

(51) Int. Cl.
*G11C 11/34* (2006.01)
*G11C 16/34* (2006.01)
*G11C 16/10* (2006.01)

(52) U.S. Cl.
CPC .......... *G11C 16/3495* (2013.01); *G11C 16/10* (2013.01); *G11C 16/3459* (2013.01)

(58) Field of Classification Search
CPC . G11C 16/10; G11C 11/5628; G11C 16/0483; G11C 2211/5621
(Continued)

(56) References Cited

U.S. PATENT DOCUMENTS 7,450,432 B2 11/2008 Wang
7,679,964 B2 3/2010 Lee
(Continued)

FOREIGN PATENT DOCUMENTS

JP 2009-301679 12/2009
KR 10-0705219 3/2007
(Continued)

*Primary Examiner* — Anthan Tran
(74) *Attorney, Agent, or Firm* — Volentine & Whitt, PLLC

(57) ABSTRACT

A method of programming a flash memory device, which is a nonvolatile memory device including a plurality of pages, includes executing an $N^{th}$ program loop of a program operation by applying an $N^{th}$ selected program voltage to a selected word line from among the plurality of pages, and performing a program verify operation by applying a program verify voltage to the selected word line, counting the number of memory cells having a threshold voltage which is greater than or equal to the program verify voltage, from among memory cells connected to the selected word line, generating a program voltage revision value based on a result of the counting and an operational condition of the $N^{th}$ program loop, and adding the program voltage revision value to an $M^{th}$ preset program voltage of an $M^{th}$ program loop executed after the $N^{th}$ program loop where M>N.

20 Claims, 30 Drawing Sheets

(58) Field of Classification Search
USPC .......................... 365/185.03, 185.14, 185.28
See application file for complete search history.

(56) References Cited

U.S. PATENT DOCUMENTS

| | | |
|---|---|---|
| 7,800,952 B2 | 9/2010 | Lee |
| 7,965,553 B2 | 6/2011 | Han |
| 8,441,859 B2 | 5/2013 | Kim et al. |
| 8,446,776 B2* | 5/2013 | Hwang ............... G11C 11/5628 |
| | | 365/185.18 |
| 8,493,792 B2 | 7/2013 | Aritome et al. |
| 9,318,191 B2 | 4/2016 | Kwak et al. |
| 2009/0296466 A1* | 12/2009 | Kim .................... G11C 11/5628 |
| | | 365/185.03 |
| 2013/0028018 A1* | 1/2013 | Cho .................... G11C 11/5628 |
| | | 365/185.03 |

FOREIGN PATENT DOCUMENTS

| | | |
|---|---|---|
| KR | 10-2009-0002470 A | 1/2009 |
| KR | 10-2011-0062543 A | 6/2011 |
| KR | 10-2014-0048392 A | 4/2014 |

\* cited by examiner

FIG. 14

|  | SSL1 | SSL2 | SSL3 |
|---|---|---|---|
| WL1 | Vpgm | Vpgm+V1 | Vpgm+V1+V2 |
| WL2 | Vpgm+V1+V2+V3 | Vpgm+V1+V2+V3+V4 | Vpgm+V1+V2+V3+V4+V5 |
| ... | ... | ... | ... |

(a)

|  | SSL1 | SSL2 | SSL3 |
|---|---|---|---|
| WL1 | Vpgm | Vpgm+V1 | Vpgm+V1+V2 |
| WL2 | Vpgm+Va+V1+V2+V3 | Vpgm+Va+V1+V2+V3+V4 | Vpgm+Va+V1+V2+V3+V4+V5 |
| ... | ... | ... | ... |

(b)

|  | SSL1 | SSL2 | SSL3 |
|---|---|---|---|
| WL1 | Vpgm | Vpgm+V1 | Vpgm+V1+V2 |
| WL2 | Vpgm | Vpgm+V3 | Vpgm+V3+V4 |
| ... | ... | ... | ... |

(c)

|  | SSL1 | SSL2 | SSL3 |
|---|---|---|---|
| WL1 | Vpgm | Vpgm+V1 | Vpgm+V1+V2 |
| WL2 | Vpgm+Va | Vpgm+Va+V3 | Vpgm+Va+V3+V4 |
| ... | ... | ... | ... |

(d)

FLASH MEMORY DEVICE REVISING PROGRAM VOLTAGE, THREE-DIMENSIONAL MEMORY DEVICE, MEMORY SYSTEM INCLUDING THE MEMORY DEVICE, AND METHODS OF PROGRAMMING THE MEMORY DEVICE

CROSS-REFERENCE TO RELATED APPLICATION

This application claims the benefit of Korean Patent Application No. 10-2016-0005318, filed on Jan. 15, 2016 in the Korean Intellectual Property Office, the disclosure of which is incorporated herein in its entirety by reference.

BACKGROUND

The inventive concept relates to a flash memory device, and more particularly, to a flash memory device revising a program voltage, a three-dimensional (3D) memory device, a memory system, and methods of programming the memory devices.

Recently, there has been increasing demand for a nonvolatile memory device which is capable of being programmed and erased electrically and which does not require refreshing by having data re-written periodically. As a method of programming the nonvolatile memory device, an incremental step pulse programming (ISPP) method is widely used. According to the ISPP method, a program operation is performed by constantly increasing a program start voltage to correspond to a step voltage. However, when the ISPP method is used when a threshold voltage distribution of a memory cell is heterogeneous, a threshold voltage distribution margin may decrease, and thus, errors may occur.

SUMMARY

The inventive concept provides a flash memory device, a three-dimensional (3D) memory device, a memory system, and methods of programming the memory devices, whereby a program loop using a program voltage suitable for characteristics of memory cells is executed during a program operation, which increases the speed of the program operation, and reduces program/read error occurrences.

According to an aspect of the inventive concept, there is provided a method of programming a flash memory device including a plurality of pages, the method including executing an $N^{th}$ program loop of a program operation by applying an $N^{th}$ program voltage to a selected word line from among the plurality of pages, and performing a program verify operation by applying a program verify voltage to the selected word line, counting the number of memory cells having a threshold voltage which is greater than or equal to the program verify voltage, from among memory cells connected to the selected word line, generating a voltage revision value based on a result of the counting and an operational condition of the $N^{th}$ program loop, and adding the voltage revision value to an $M^{th}$ preset program voltage of an $M^{th}$ program loop executed after the $N^{th}$ program loop.

According to another aspect of the inventive concept, there is provided a method of programming a three-dimensional (3D) memory device including a plurality of memory cell groups including a first memory cell group and a second memory cell group each connected to a first selected word line, the method including executing an $N^{th}$ program loop of a program operation by applying an $N^{th}$ program voltage to the first memory cell group connected to the first selected word line, and performing a program verify operation by applying a program verify voltage to the first memory cell group connected to the first selected word line, counting the number of memory cells having a threshold voltage which is greater than or equal to the program verify voltage, from among memory cells included in the first memory cell group connected to the first selected word line, generating a voltage revision value based on a result of the counting and an operational condition of the $N^{th}$ program loop, and adding the voltage revision value to an $M^{th}$ preset program voltage of an $M^{th}$ program loop executed after the $N^{th}$ program loop.

According to yet another aspect of the inventive concept, there is a provided a method, comprising: executing one program loop of a program operation for a group of memory cells of a memory device, by: applying a program voltage to the memory cells, and performing a program verify operation by applying a program verify voltage to the memory cells; subsequent to executing the one program loop of the program operation, counting a number of memory cells, among the group of memory cells, which have a threshold voltage which is greater than or equal to the program verify voltage; generating a voltage revision value based at least in part on a result of the counting; adding the voltage revision value to a preset program voltage for an other program loop to produce an adjusted program voltage; and executing the other program loop of the program operation for the group of memory cells of the memory device by applying the adjusted program voltage to the memory cells.

BRIEF DESCRIPTION OF THE DRAWINGS

Exemplary embodiments of the inventive concept will be more clearly understood from the following detailed description taken in conjunction with the accompanying drawings in which:

FIG. 14 is a view for describing a method of generating a revision value between word lines, the method being performed by a 3D memory device, according to an embodiment.

DETAILED DESCRIPTION OF THE EMBODIMENTS

Figure 1:
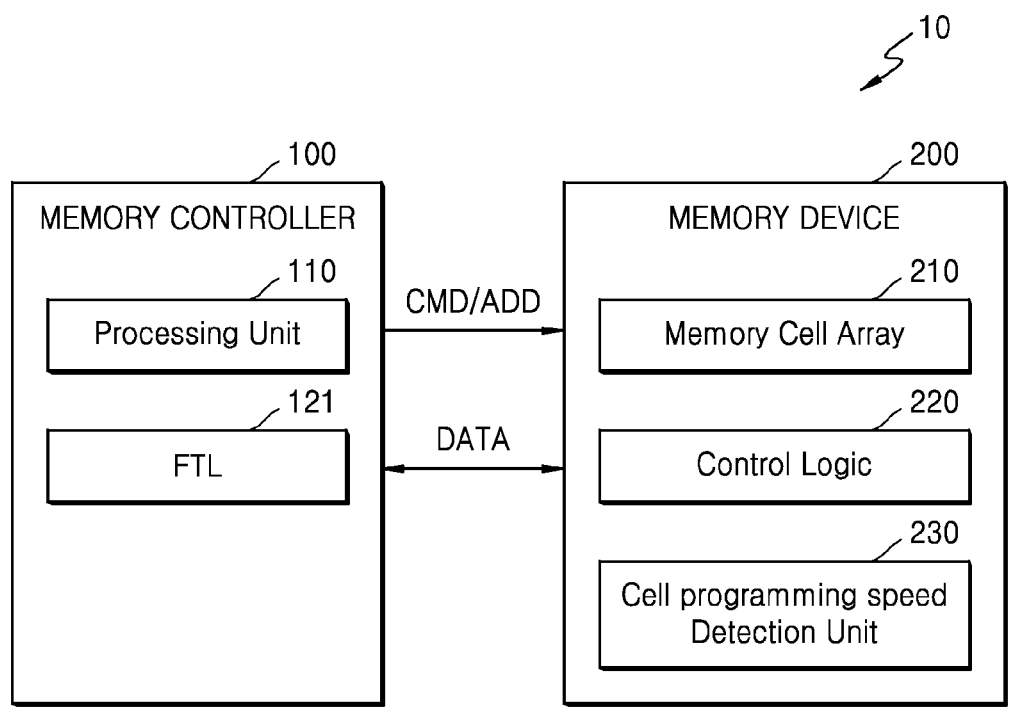
FIG. 1 is a block diagram of an embodiment of a memory system.

Hereinafter, the inventive concept will now be described more fully with reference to the accompanying drawings, in which exemplary embodiments of the inventive concept are shown. Like reference numerals in the drawings denote like elements, and a repeated explanation will not be given of overlapping features. These inventive concepts may, however, be embodied in different forms and should not be construed as limited to the embodiments set forth herein. Rather, these embodiments are provided so that this disclosure is thorough and complete and fully conveys the inventive concept to those of ordinary skill in the art. It should be understood that exemplary embodiments of the inventive concept are to cover all modifications, equivalents, and alternatives falling within the spirit and scope of the inventive concept. In the attached drawings, sizes of structures may be exaggerated for clarity. As used herein, the term "and/or" includes any and all combinations of one or more of the associated listed items. Expressions such as "at least one of," when preceding a list of elements, modify the entire list of elements and do not modify the individual elements of the list.

The terminology used herein is for describing particular embodiments and is not intended to be limiting of exemplary embodiments. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or," includes any and all combinations of one or more of the associated listed items.

Unless otherwise defined, all terms (including technical and scientific terms) used herein have the same meanings as commonly understood in the art to which the exemplary embodiments belong. It will be further understood that the terms such as those defined in commonly used dictionaries should be interpreted as having meanings consistent with their meanings in the context of the relevant art and will not be interpreted in an idealized or overly formal sense unless expressly so defined herein.

FIG. 1 is a block diagram of an embodiment of a memory system 10.

As illustrated in FIG. 1, memory system 10 may include a memory controller 100 and a memory device 200. Memory controller 100 may perform a control operation for memory device 200. For example, memory controller 100 may provide an address ADD and a command CMD to memory device 200 to control write (or program), read, and erase operations of memory device 200. Also, program data DATA for the program operation, and read data DATA may be exchanged between memory controller 100 and memory device 200.

Memory device 200 may include a memory cell array 210, control logic 220, and a cell programming speed detection unit 230. Memory cell array 210 may include a plurality of memory cells arranged in regions in which a plurality of word lines and a plurality of bit lines cross each other. Memory cell array 210 may include non-volatile memory cells to store data DATA in a non-volatile method. The non-volatile memory cells may include flash memory cells, such as a NAND flash memory cell array, a NOR flash memory cell array, or the like. Hereinafter, embodiments of the present inventive concept will be described by assuming that memory cell array 210 includes the flash memory cells, and thus, memory device 200 is a flash memory device.

Memory controller 100 may include a processing unit 110 and a flash transformation layer (FTL) 121. FTL 121 may include system software (or firmware) executing management operations with respect to write, read, and erase operations of the flash memory device, and may be loaded onto an operating memory (not shown) to be driven by processing unit 110.

Processing unit 110 may control general operations of memory controller 100. FTL 121 may transform a logical address to a physical address and provide the physical address to memory device 200, in response to a request, from a host, to access data in memory device 200. Also, FTL 121 may perform a managing operation with respect to various cell regions (for example, a chip unit, a block unit, a page unit, etc.) included in memory cell array 210. For example, FTL 121 may process a cell region having deteriorated characteristics due to a progressive defect, etc., as a bad region, in order to prevent data from being written to the cell region having the deteriorated characteristics.

Meanwhile, memory cell array 210 may be realized to have various shapes. For example, memory cell array 210 may include three-dimensional (3D) (or vertical) NAND (VNAND) memory cells. Also, when memory device 200 includes a plurality of flash memory chips, memory cell array 210 may include memory cells included in the plurality of flash memory chips. Also, memory cell array 210 may include a plurality of blocks, each of which may include a plurality of pages. For example, a block may be an erase unit of memory device 200 (that is, a unit by which memory cells in memory device 200 are erased), and a page may be a program/read unit of memory device 200 (that is, a unit by which memory cells in memory device 200 are programmed and read).

Memory device 200 may perform program and erase operations under control of memory controller 100. Memory device 200 performs a data program operation according to a write command from memory controller 100. The data program operation may be performed by a plurality of program loops. Program voltages in the plurality of program loops may have different predetermined or preset "nominal" voltage levels from one program loop to another, and these preset program voltages may be stored in memory device 200, for example in memory or one or more registers accessible by control logic 220. For example, in sequential program loops of an incremental step pulse program (ISPP) method, the preset program voltages may sequentially increase.

In memory system 10, memory device 200 may detect a programming speed of memory cells to be programmed, and may revise a level of a program voltage, which is related to the program operation, according to a result of the detection, to produce an adjusted program voltage. Various methods of detecting the programming speed of the memory cells may be realized. For example, with respect to the memory cells which are to be programmed by applying a program voltage and on which a program loop applying a program verify voltage for verification is to be executed, the programming speed of the memory cells may be detected by counting memory cells having a threshold voltage that is greater than or equal to a reference voltage. In some embodiments, the reference voltage may be the program verify voltage. In some embodiments, the reference voltage may be a low level program verify voltage that is less than the program verify voltage.

According to an embodiment, memory device 200 may generate a voltage revision value by using a result of counting the number of memory cells having a threshold voltage which is greater than or equal to the reference voltage, and add the generated voltage revision value to a program voltage of a program loop that is to be executed later. For example, cell programming speed detection unit 230 may count the number of memory cells having a threshold voltage which is greater than or equal to a first program verify voltage from among memory cells connected to a first word line, when a first program loop is executed by using a first preset or "nominal" program voltage and the first program verify voltage, with respect to the first word line. Control logic 220 may generate a first voltage revision value based on a result of the counting and an operational condition of the first program loop. Thereafter, with respect to the first word line, when a second program loop is executed by using a preset or "nominal" second program voltage and the first program verify voltage with respect to the first word line, control logic 220 may add the first voltage revision value to the preset second program voltage to produce an adjusted second program voltage. Here, again, the preset second program voltage may be stored in memory or registers associated with control logic 220. Also, according to an embodiment, whenever each of a plurality of subsequent program loops is executed with respect to a word line, memory device 200 may perform a program operation by generating a voltage revision value and adding the voltage revision value to the corresponding preset program voltage for one or more of the plurality of subsequent program loops. Detailed descriptions with respect to this arrangement will be given later.

By applying this procedure, when the plurality of program loops are executed with respect to a word line, if a programming speed of the memory cells connected to the word line is high, a negative voltage revision value may be generated to decrease the cell programming speed, and if the programming speed is low, a positive voltage revision value may be generated to increase the cell programming speed. Through this method, a more uniform threshold voltage distribution of the memory cells generated as a result of the execution of the program loop may be realized.

Figure 2A:
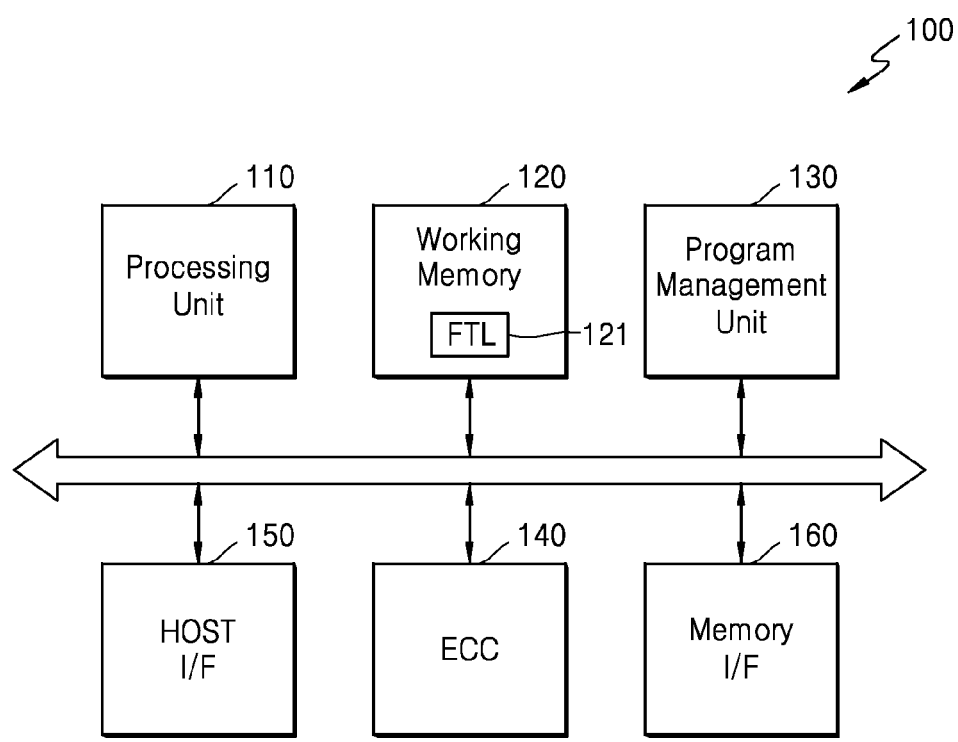
FIGS. 2A and 2B are block diagrams of an example of a memory controller of FIG. 1.
Figure 2B:
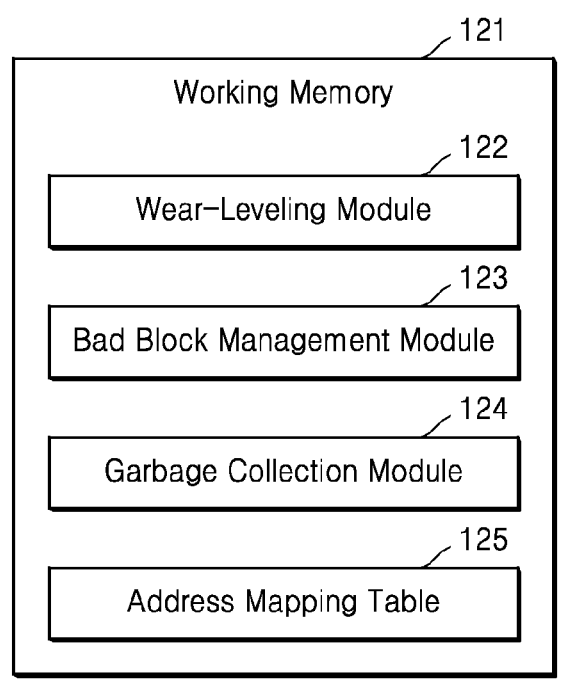

FIGS. 2A and 2B are block diagrams of an example of memory controller 100 of FIG. 1.

Referring to FIGS. 2A and 2B, memory controller 100 may include processing unit 110, a working memory 120, a program managing unit 130, an error correction unit (ECC) 140, a host interface (I/F) 150, and a memory interface (I/F) 160. FTL 121 may be loaded into working memory 120. As described above, FTL 121 may include firmware, and according to a function realized by the firmware, FTL 121 may include a wear-leveling module 122, a bad block managing module 123, a garbage collection module 124, and an address mapping table 125.

Although not shown in FIGS. 2A and 2B, memory controller 100 may further include various components in addition to the illustrated and described components. For example, memory controller 100 may further include read only memory (ROM) for storing code data necessary for initial booting of a device implementing a memory system, and/or a buffer memory controller for controlling a buffer memory device. Also, memory controller 100 may further include a command generating module (not shown) for generating a command CMD for controlling a memory operation in response to a request of a host.

Processing unit 110 may include a central processing unit or a micro processor and may control a general operation of memory controller 100. Processing unit 110 may drive the firmware loaded onto working memory 120 to control memory controller 100. Memory controller 100 may communicate with an external host via various standard interfaces and host interface 150 may provide an interface between the host and memory controller 100. Host interface 150 may employ various interface methods including standard protocols, such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), a secure digital (SD) card, a multi media card (MMC), an embedded multi media card (eMMC), a universal flash storage (UFS) memory device, a compact flash (CF) card, etc.

Meanwhile, memory interface 150 may provide an interface between memory controller 100 and memory device 200. For example, write data and read data may be transmitted and received to and from memory device 200 via memory interface 150. Also, memory interface 150 may provide a command CMD and an address ADD to memory device 200, and may receive various information from memory device 200 and provide the information to memory controller 100.

Meanwhile, working memory 120 may store firmware for controlling memory controller 100 and meta data necessary for driving the firmware. Working memory 120 may be realized by various types of memories. For example, working memory 120 may be realized as at least one of a cache memory, dynamic random access memory (DRAM), static random access memory (SRAM), parameter random access memory (PRAM), and a flash memory.

Wear-leveling module 122 manages a wear level of memory cells of memory device 200. The memory cells may be aged due to write and erase operations, etc., and the aged memory cells (or worn memory cells) may cause defects to occur. Wear leveling module 122 may manage a program and erase cycle with respect to a memory cell array to prevent a specific cell region from being more rapidly worn out than other cell regions. For example, wear leveling module 122 may manage address mapping table 125 such that the number of program and erase operations are evenly given to the cell regions of the memory cell array.

Meanwhile, bad block managing module 123 manages a block in which a defect occurs from among a plurality of blocks provided in memory device 200. For example, as described above, when the number of program/erase cycles increases, a set value of the number of program/erase loops for a program/erase operation may be changed, and based on the changed set value, a block in which a program fail or an erase fail occurs may be processed as a bad block. Bad block managing module 123 may manage address mapping table 125 such that data is prevented from being written to the block which is processed or designated as the bad block.

Meanwhile, garbage collection module 124 may arrange blocks in which broken or corrupted data is stored. For example, in a flash memory device, an erase unit (that is, the number or memory cells which are erased in an erase operation) may be set to be greater than a program unit (that is, the number or memory cells which are programmed in a program operation), and after program and erase operations are repeatedly performed, an operation of gathering sequential data distributed in physically different locations to the same address region by using a random free block may be performed. According to the operation of garbage collection module 124, a free block may be generated.

Meanwhile, the address mapping table 125 may store mapping information between a logical address which may be received by memory controller 100 from a host, and a physical address indicating a physical location in memory device 200 where actual data is to be accessed, the physical address corresponding to the logical address. By referring to the mapping information, the logical address provided from the host may be transformed into the physical address indicating the physical location of the memory cell which is to be actually accessed. According to an embodiment, data processed as a program fail may be stored in another cell region (for example, a page) of memory device 200, and in this case, the mapping information between the logical address and the physical address may be changed. The changed mapping information may be updated in address mapping table 125.

Also, in address mapping table 125, the mapping information may be changed according to a result of management of various functional blocks described above. For example, data written to memory cells with an increased wear-level or to memory cells processed as a bad block is shifted to normal memory cells, and in correspondence to this, the mapping information between the logical address and the physical address may be changed. Also, after data is shifted by the garbage collection operation, the mapping information between the logical address and the physical address may be changed.

Meanwhile, program managing unit 130 may manage various settings related to a program operation of memory device 200 during a program operation of memory system 10. For example, program managing unit 130 may perform setting of a program voltage when executing a program loop operation of memory device 200. For example, memory device 200 may perform a program operation by generating a plurality of voltage revision values and adding the plurality of voltage revision values to preset or "nominal" program voltages of a plurality of program loops, as described above, in order to execute the plurality of program loops with respect to a selected word line. Here, program managing unit 130 may store information about the voltage revision values and the program loops (e.g., preset or "nominal" program voltages for each of the program loops) to which the voltage revision values are added. Also, when memory device 200 executes a plurality of program loops again with respect to the selected word line, memory device 200 may not generate the voltage revision values, and may execute the program loops based on the information stored in program managing unit 130. Error correction unit 140 may perform error detection and correction operations with respect to read data DATA provided from memory device 200. According to another embodiment, the error detection and correction functions may be provided in memory device 200.

Figure 3:
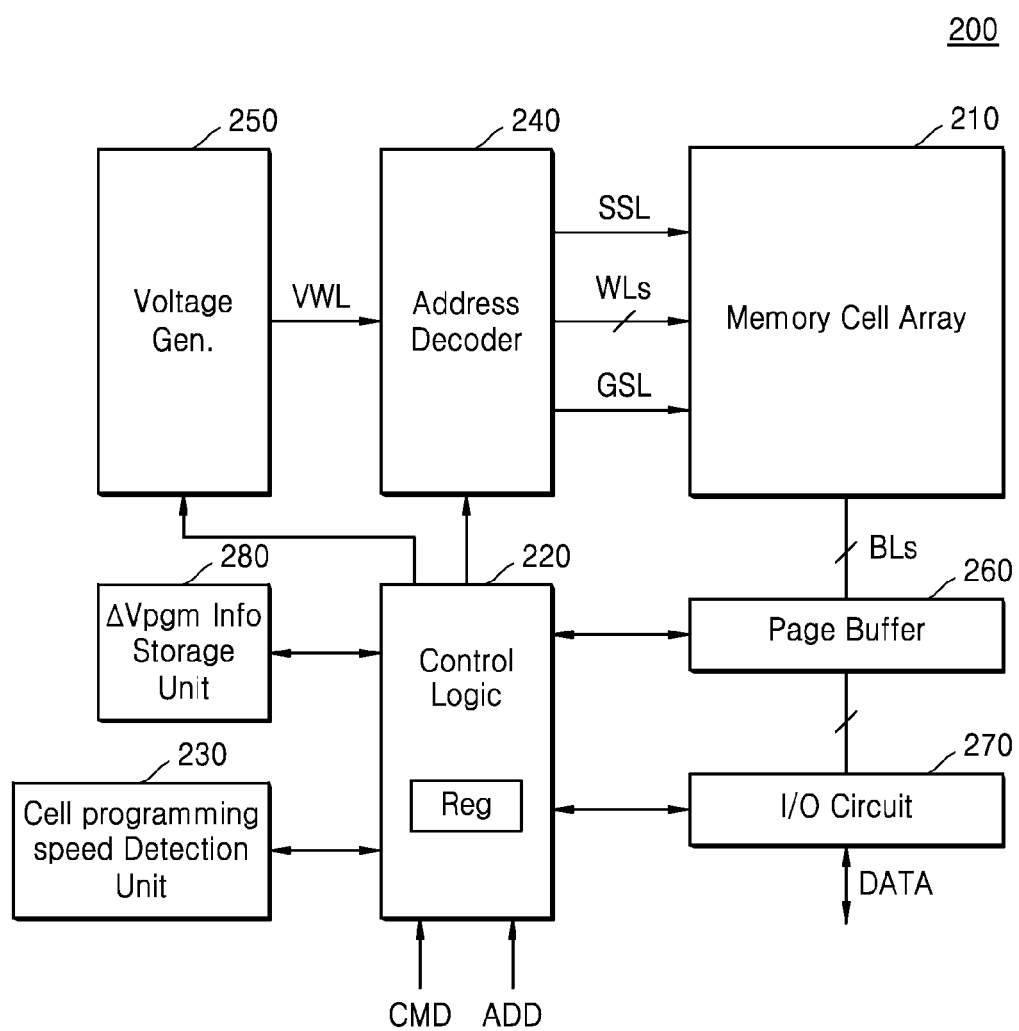
FIG. 3 is a block diagram of an example of a memory device of FIG. 1.

FIG. 3 is a block diagram of an example of memory device 200 of FIG. 1.

As illustrated in FIG. 3, memory device 200 may include memory cell array 210, control logic 220, and cell programming speed detection unit 230. Also, memory device 200 may further include an address decoder 240, a voltage generator 250, a page buffer 260, an input and output circuit 270, and a voltage revision value related information storage unit 280.

Memory cell array 210 may be connected to one or more string selection lines SSLs, a plurality of word lines WLs (including normal word lines and dummy word lines), and one or more ground selection lines GSLs. Also, memory cell array 210 may be connected to a plurality of bit lines BLs. Voltage generator 250 may generate one or more word lines voltages VWLs, and the word lines voltages VWLs may be provided to address decoder 240. Program data DATA to be written to memory cell array 210 may be provided to memory device 200 via input and output circuit 270 and temporarily stored in page buffer 260. Also, the read data DATA which is read from memory cell array 210 may be provided to the outside of memory device 200 via page buffer 260 and input and output circuit 270. Control logic 220 may provide various control signals related to a memory operation to address decoder 240, voltage generator 250, and other various functional blocks.

According to the embodiment described above, memory device 200 may execute the program loop by applying the program voltage and the program verify voltage to a selected word line, and may count the number of memory cells having a threshold voltage which is greater than or equal to the program verify voltage, from among the memory cells connected to the selected word line. Memory device 200 may generate the voltage revision value based on a result of the counting and an operational condition of the program loop, and may add the voltage revision value to the preset or "nominal" program voltage that is used to execute a subsequent (e.g., the next) program loop with respect to the selected word line.

When control logic 220 executes a program loop with respect to a word line, cell programming speed detection unit 230 may receive a cell programming speed detection command from control logic 220, detect a cell programming speed of the memory cells based on a counting operation that is in series with or in parallel to the execution of the program loop, and provide a result of the detection to control logic 220.

Control logic 220 may detect the cell programming speed and based on the detected cell programming speed may generate the voltage revision value. Control logic 220 may include a register Reg to store the generated voltage revision value. The register Reg may store a plurality of voltage revision values, and may further include revision values of memory cell groups and revision values of word lines, which are to be described later. Control logic 220 may execute the program loop of memory device 200 based on the information stored in the register Reg.

Voltage revision value-related information storage unit 280 may store various information related to the voltage revision value, which may be referred to by control logic 220 to generate the voltage revision value. According to an embodiment, voltage revision value-related information storage unit 280 may include a plurality of look-up tables for storing information about the voltage revision value corresponding to an operational condition of various program loops and the detected cell programming speed result. Control logic 220 may generate the voltage revision value by using information related to the operational condition of each executed program loop, the result of the cell programming speed detection from cell programming speed detection unit 230, and the information of voltage revision value-related information storage unit 280. Control logic 220 may store the generated voltage revision value in the register Reg. According to another embodiment, voltage revision value-related information storage unit 280 may be realized using any of various different arrangements. For example, voltage revision value-related information storage unit 280 may be included as part of control logic 220.

Meanwhile, control logic 220 may execute another program loop by using the generated voltage revision value. According to an embodiment, after the generated voltage revision value is added to a preset or "nominal" program voltage, which may be used to execute other program loops with respect to a word line, to produce an adjusted program voltage, the program loop may be executed by using the adjusted program voltage.

Figure 4A:
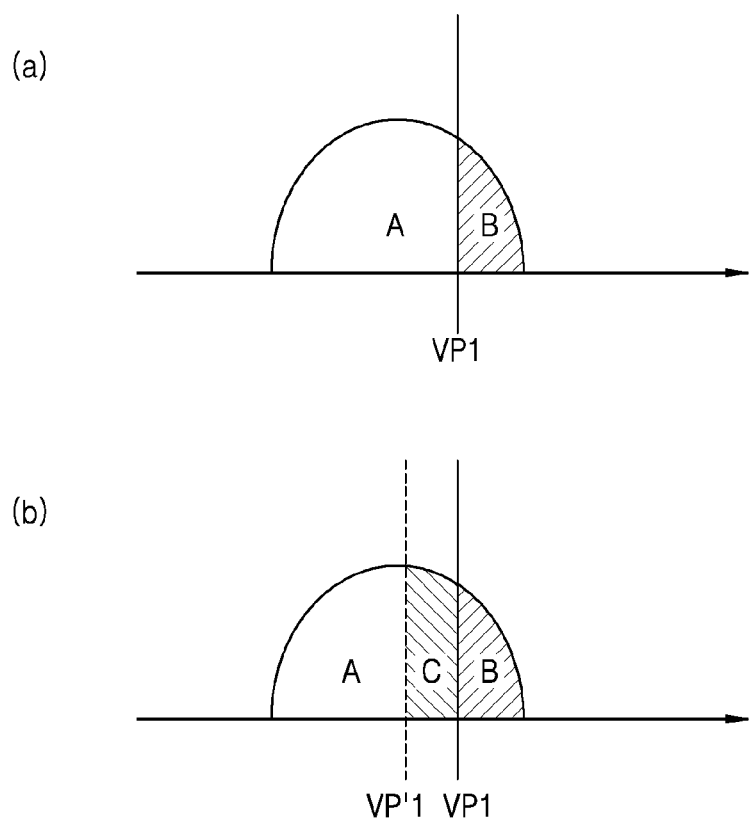
FIG. 4A is a view for describing an operation of an embodiment of a cell programming speed detection unit.
Figure 4B:
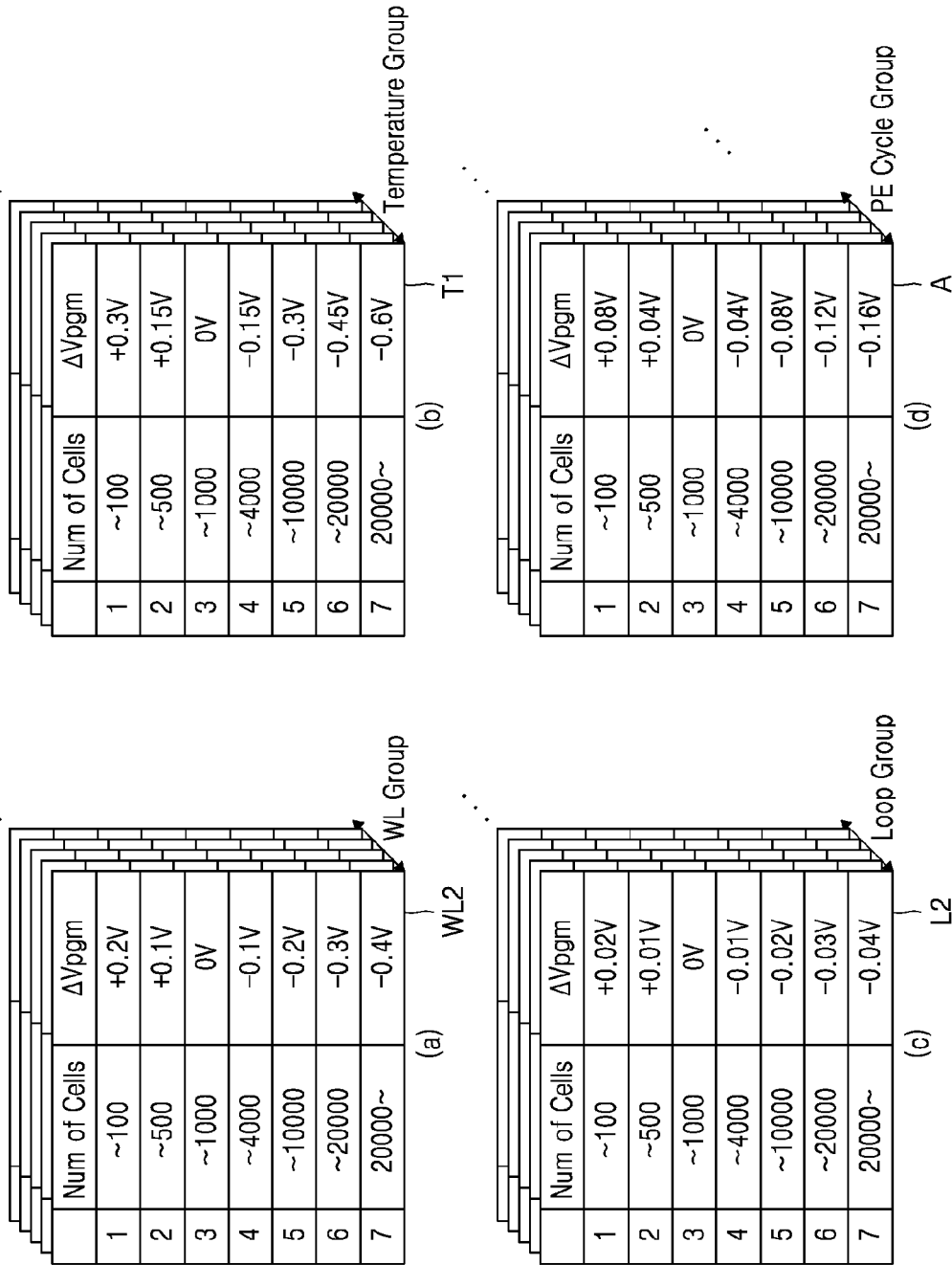
FIG. 4B is a view for describing an embodiment of a storage unit of voltage revision value-related information.

FIG. 4A is a view for describing an embodiment of an operation of the cell programming speed detection unit 230. FIG. 4B is a view for describing an embodiment of voltage revision value-related information storage unit 280.

As illustrated in FIG. 3 and (a) of FIG. 4A, cell programming speed detection unit 230 may count the number of memory cells of a region B, the memory cells having a threshold voltage which is greater than or equal to a program verify voltage VP1, from among memory cells connected to a word line, which is an object of a program loop. As described above, cell programming speed detection unit 230 may count the number of memory cells by using one program verify voltage. Also, according to an embodiment, a result of the counting generated by cell programming speed detection unit 230 may be a bit unit. Cell programming speed detection unit 230 may determine a speed of the memory cells connected to the word line based on the number of memory cells of the region B. That is, as the number of memory cells of the region B increases, it may be determined that the speed of the memory cells is higher.

Also, as illustrated in FIG. 3 and (b) of FIG. 4A, cell programming speed detection unit 230 may count the number of memory cells by using two program verify voltages VP1 and VP'1. According to an embodiment, cell programming speed detection unit 230 may use the program verify voltage VP1 and the low level program verify voltage VP1' which is less than the program verify voltage VP1. For example, cell programming speed detection unit 230 may count the number of memory cells of the region B, and the number of memory cells of a region C, the memory cells having a threshold voltage which is greater than or equal to the low level program verify voltage VP1', and a voltage revision value may be generated by using the counted number of memory cells in regions B and C.

According to another embodiment, cell programming speed detection unit 230 may perform a first count operation with respect to the number of memory cells of the region B, i.e., the memory cells having a threshold voltage which is greater than or equal to the program verify voltage VP1, and may perform a second count operation with respect to the number of memory cells of the region C, i.e., the memory cells having a threshold voltage which is greater than or equal to or higher than the low level program verify voltage VP1' and which is also less than or equal to the program verify voltage VP1. Control logic 220 may generate the voltage revision value based on a result of the first count operation, and generate a bit line voltage revision value applied to the memory cells of the region C based on a result of the second count operation. Furthermore, control logic 220 may generate the first voltage revision value based on the result of the first count operation and an operational condition of a program loop, and may generate the bit line voltage revision value based on the result of the second count operation and the operational condition of the program loop. Control logic 220 may execute the program loop by adding the generated voltage revision value to a program voltage of another program loop, and may execute the program loop by adding the bit line voltage revision value to a bit line voltage applied to the memory cells of the region C in another program loop.

As illustrated in FIGS. 3 and 4B, voltage revision value-related information storage unit 280 may store various information related to the voltage revision values, which may be referred to by control logic 220 to generate the voltage revision value. According to an embodiment, voltage revision value-related information storage unit 280 may include a plurality of look-up tables for storing the information about voltage revision values corresponding to operational conditions of various program loops and the detected cell programming speed result. That is, the look-up tables may include voltage revision values corresponding to results of counting the number of memory cells having a threshold voltage which is greater than or equal to a program verify voltage, which may indicate the cell programming speed.

Also, according to an embodiment, voltage revision value-related information storage unit 280 may include the look-up table related to at least one of order information of program loops (Loop group), temperature information when each program loop is executed (Temperature group), information of an object word line of each program loop (WL group), and program/erase cycle information with respect to the object word line or a block including the object word line (PE cycle group). According to an embodiment, referring to (a) of FIG. 4B, when the program loop is executed with respect to a second word line WL2, voltage revision value-related information storage unit 280 may include the look-up table related to the object word line information indicating voltage revision values ΔVpgm corresponding to results of counting (Num of cells). Also, referring to (b) of FIG. 4B, when the program loop is executed at a first temperature T1, voltage revision value-related information storage unit 280 may include the look-up table related to the temperature information indicating voltage revision values ΔVpgm corresponding to results of counting (Num of cells). Also, referring to (c) of FIG. 4B, when the program loop is a second loop L2, voltage revision value-related information storage unit 280 may include the look-up table related to the program loop order information indicating voltage revision values ΔVpgm corresponding to results of counting (Num of cells). Referring to (d) of FIG. 4B, when the program/erase cycle information with respect to the object word line or the block including the object word line is A times, voltage revision value-related information storage unit 280 may include the look-up table related to the program/erase cycle information indicating voltage revision values ΔVpgm corresponding to results of counting (Num of cells).

According to an embodiment, control logic 220 may select at least one of the look-up tables related to the object word line information of the program loop, the temperature information when the program loop is executed, the order information of the program loop, and the program/erase cycle information, and may generate the voltage revision value based on the selected look-up table. For example, control logic 220 may select for reference only the temperature information when the program loop is executed, and when the result of counting is 490, control logic 220 may generate the voltage revision value as +0.15V, and may add the voltage revision value of +0.15V to a preset or "nominal" program voltage when another program loop is executed. However, the illustrated look-up tables only represent an example embodiment, and the present inventive concept is not limited thereto. Control logic 220 may generate various voltage revision values and have various counting results.

Furthermore, control logic 220 may set a priority order of operational conditions of the program loop. Based on the priority order, control logic 220 may generate the voltage revision value by referring to various information related to the voltage revision value, which is stored in voltage revision value-related information storage unit 280. The priority order-related information may be stored in control logic 220 and may be set and/or changed by a host.

Figure 5A:
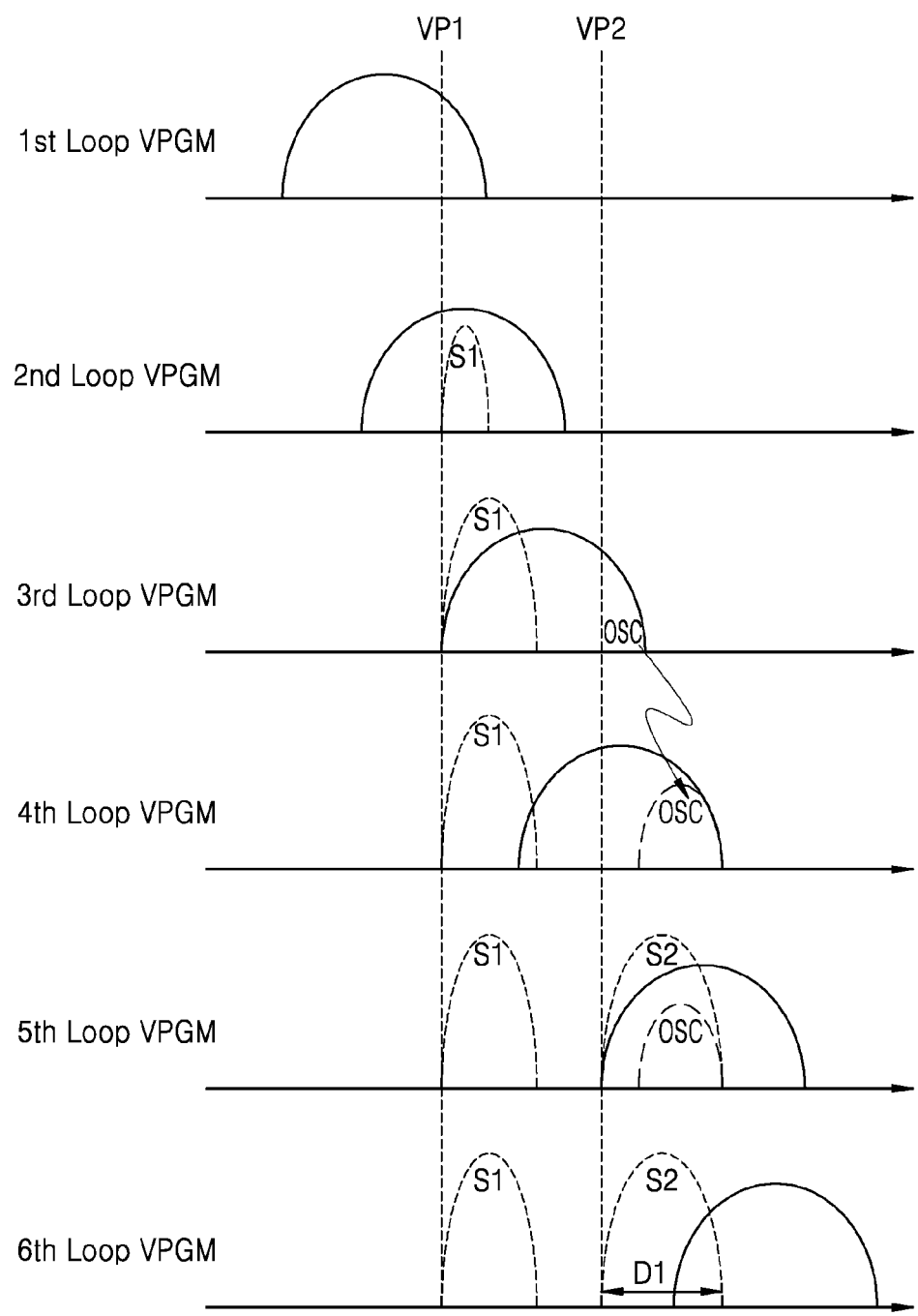
FIGS. 5A, 5B and 5C are views for describing an embodiment of a method of programming a flash memory device configured to revise a program voltage.
Figure 5B:
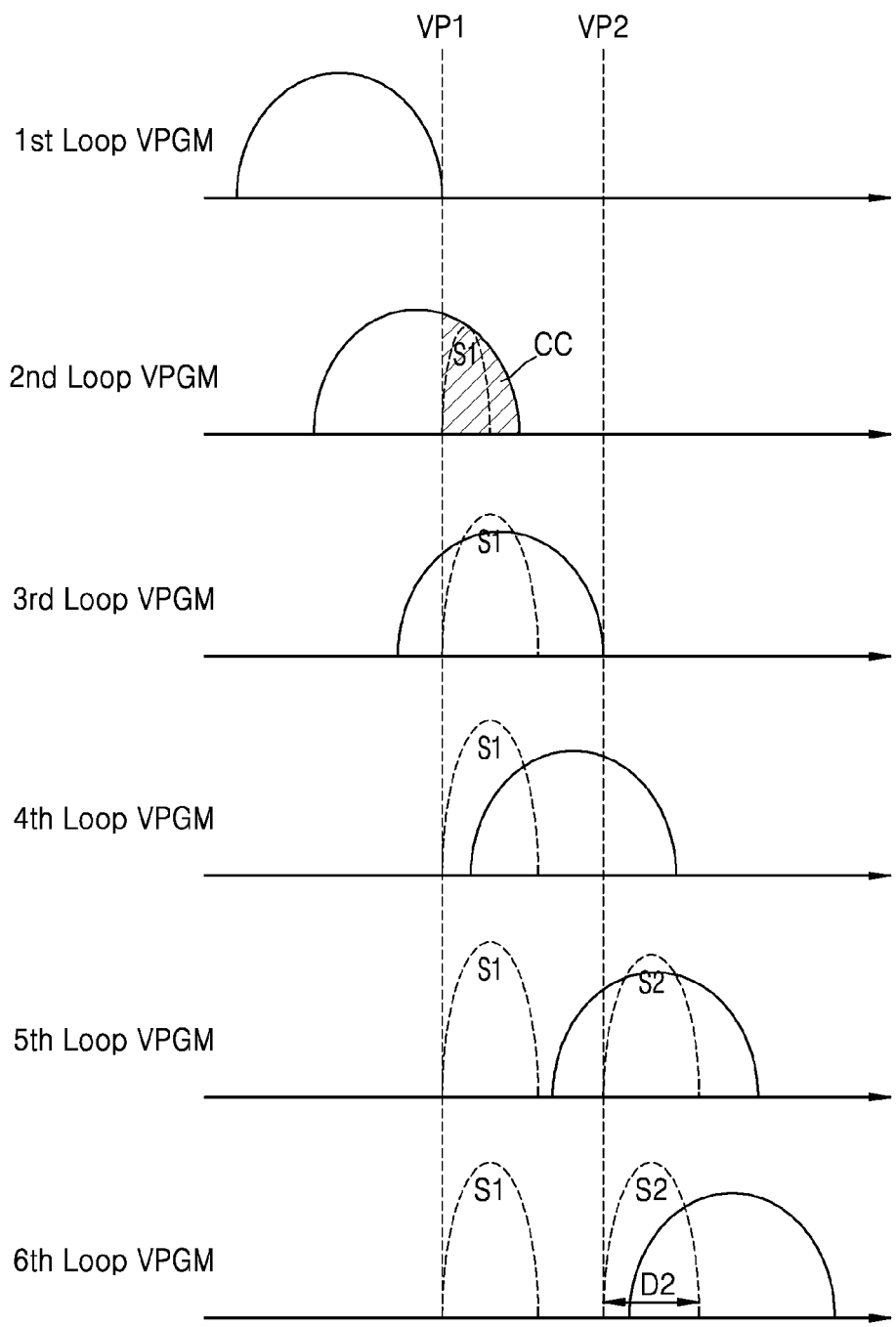
Figure 5C:
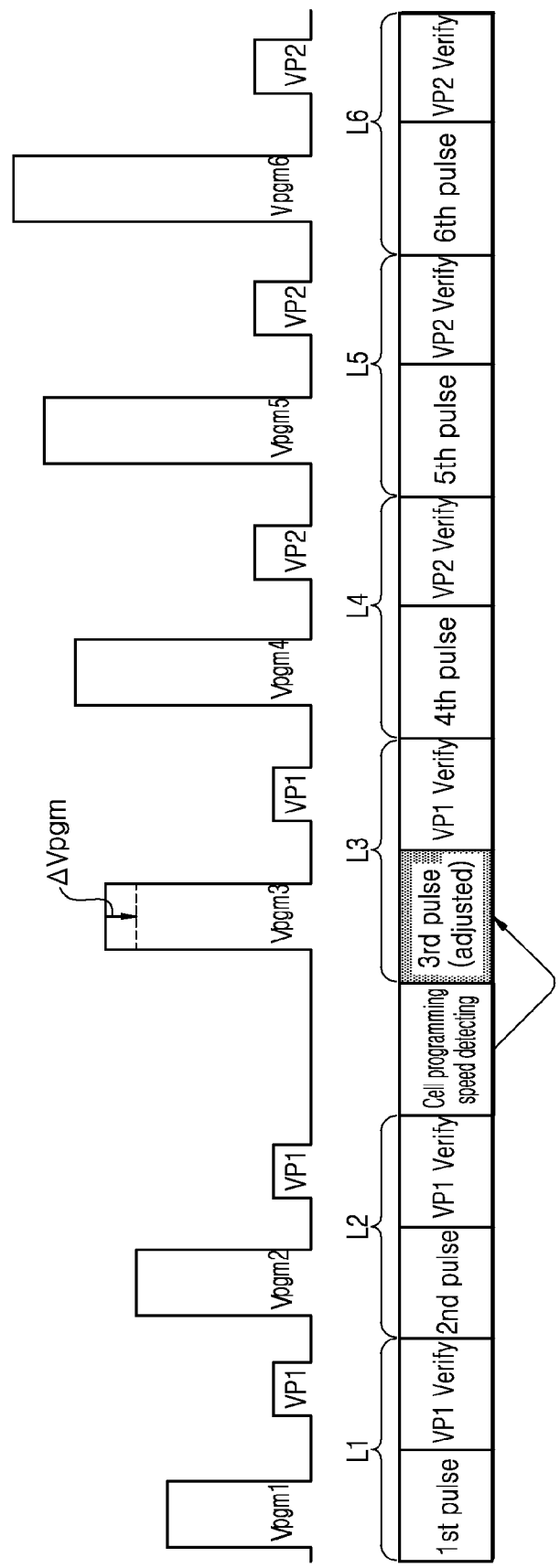

FIGS. 5A through 5C are views for describing an embodiment of a method of programming a flash memory device for revising a program voltage.

As illustrated in FIG. 5A, when a programming speed of memory cells, which are to be programmed, is high, some of the memory cells may not be inhibited as in a third program loop $3^{rd}$ Loop VPGM, and may become over-programmed memory cells OSC in which a threshold voltage distribution is shifted to a third program voltage. Due to the over-programmed memory cells OSCs, a range D1 of the threshold voltage distribution of second state memory cells S2 may become wider than a range of the threshold voltage distribution of first state memory cells S1, and thus, it is more likely that errors occur during a read operation of programmed data.

Accordingly, as illustrated in FIGS. 5B and 5C, cell programming speed detection unit 230 may serially count the number of memory cells CCs having a threshold voltage which is greater than or equal to the first program verify voltage VP1 after the second program loop $2^{nd}$ Loop VPGM, L2 is executed, and may generate the voltage revision value ΔVpgm based on a result of the counting and an operational condition of the second program loop $2^{nd}$ Loop VPGM, L2. Thereafter, control logic 220 may revise a voltage level of a third program voltage Vpgm3 to be lower than a previously preset, or "nominal," value thereof, by adding the voltage revision value ΔVpgm (here, a negative value) to the third program voltage Vpgm3 of the third program loop $3^{rd}$ Loop VPGM, L3 which is sequentially executed after the second program loop $2^{nd}$ Loop VPGM, L2. Thus, the occurrence of the over-programmed memory cells OSC due to a high cell programming speed may be prevented. In FIG. 5C, it is illustrated that the voltage revision value ΔVpgm is generated only after the execution of the second program loop $2^{nd}$ Loop VPGM, L2, for convenience of explanation. However, the voltage revision value corresponding to each of the program loops L1 through L6 may be generated after execution of each of the program loops L1 through L6.

Figure 6A:
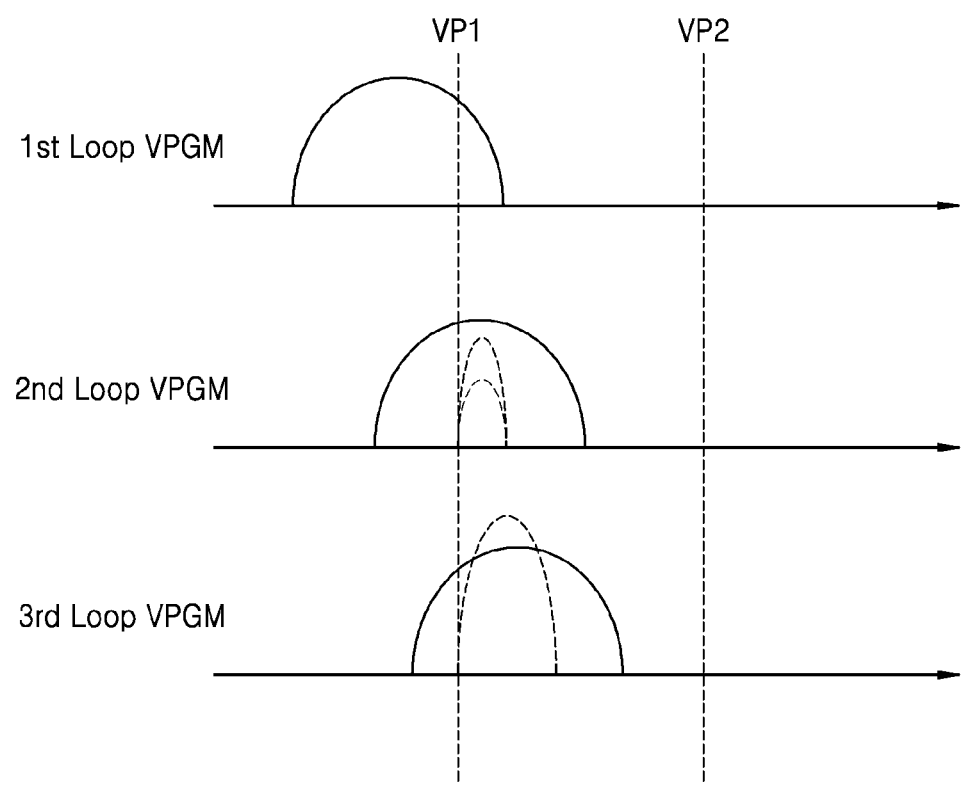
FIGS. 6A, 6B, and 6C are views for describing another embodiment of a method of programming a flash memory device configured to revise a program voltage.
Figure 6B:
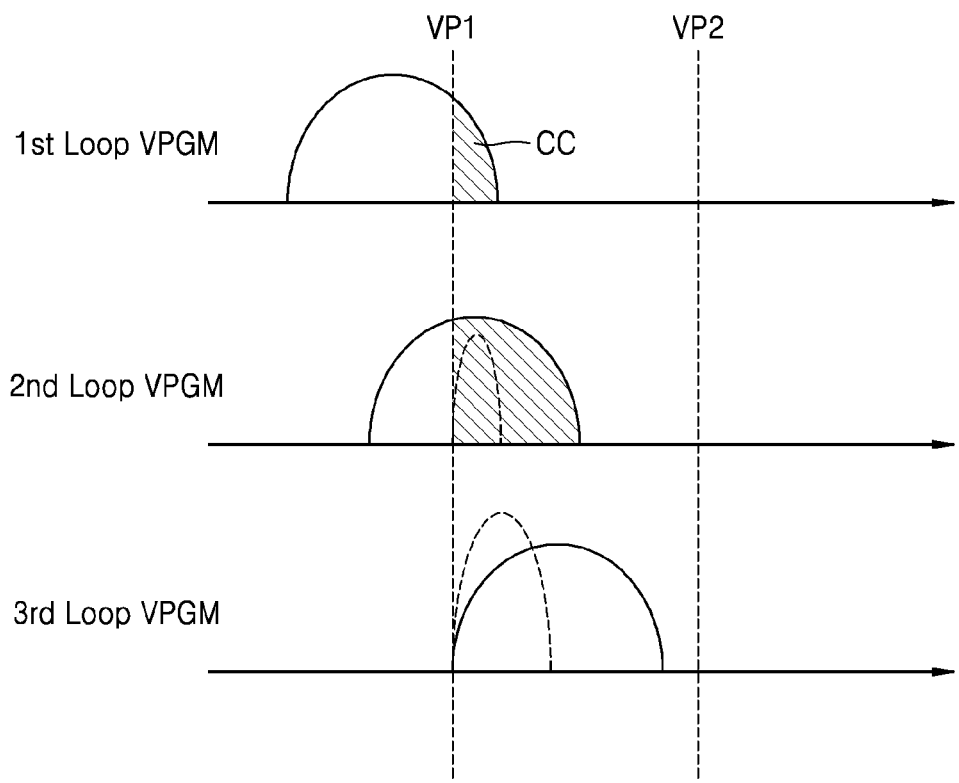
Figure 6C:
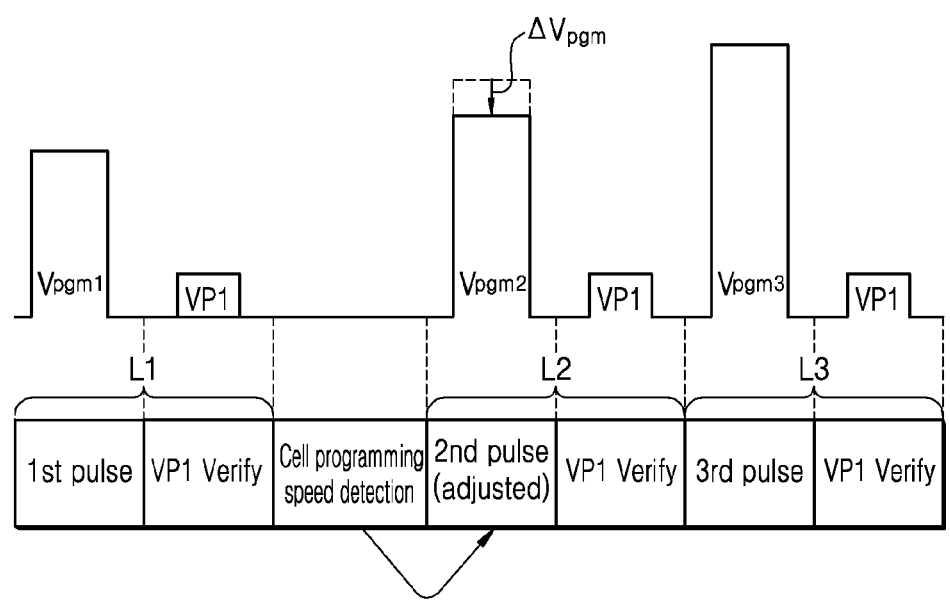

FIGS. 6A through 6C are views for describing another embodiment of a method of programming a flash memory device for revising a program voltage.

As illustrated in FIG. 6A, when the programming speed of the memory cells to be programmed is low, the memory cells having a threshold voltage which is less than or equal to the first program verify voltage VP1 may occur in the third program loop $3^{rd}$ Loop VPGM. As shown above, when the programming speed of the memory cells is low, the number of program loops increases, and thus, the speed of the program operation may decrease.

Therefore, as illustrated in FIGS. 6B and 6C, cell programming speed detection unit 230 may serially count the number of memory cells CC having the threshold voltage which is greater than or equal to the first program verify voltage VP1, after executing the first program loop $1^{st}$ Loop VPGM, and may generate the voltage revision value ΔVpgm based on a result of the counting and an operational condition of the first program loop $1^{st}$ Loop VPGM. Thereafter, control logic 220 may revise a voltage level of a second program voltage Vpgm2 to be higher than a previously preset, or "nominal," value thereof, by adding the voltage revision value ΔVpgm (here, a positive value) to the second program voltage Vpgm2 of the second program loop $2^{nd}$ Loop VPGM, L2 which is sequentially executed after the first program loop $1^{st}$ Loop VPGM, L1. Thus, the cell programming speed may increase so that the program operation is rapidly performed. In FIG. 6C, it is illustrated that the voltage revision value ΔVpgm is generated only after the execution of the first program loop $1^{st}$ Loop VPGM, L1, for convenience of explanation. However, the voltage revision value corresponding to each of the program loops L1 through L3 may be generated after execution of each of the program loops L1 through L3.

FIGS. 7A through 7E are views for describing an embodiment of a method of programming a flash memory device. Hereinafter, as an example, it is assumed that a program loop with respect to a selected word line is executed seven times.

Figure 7A:
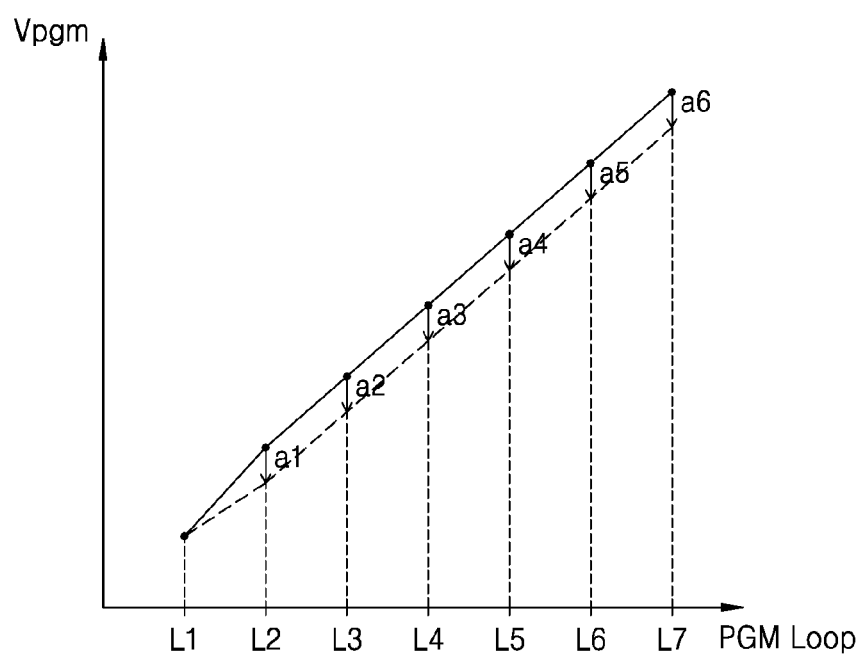
FIGS. 7A, 7B, 7C, 7D and 7E are views for describing an embodiment of a method of programming a flash memory device.
Figure 7B:
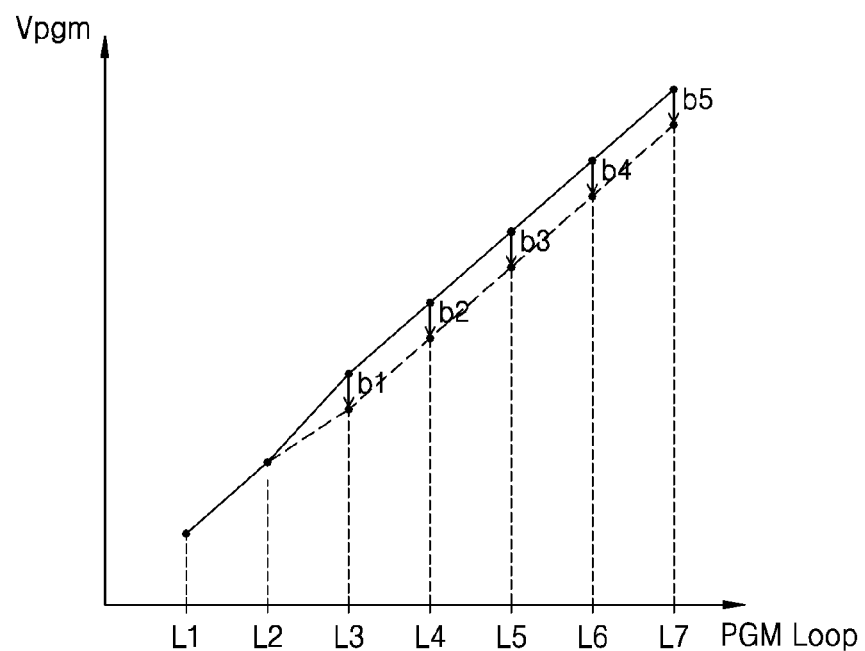

As illustrated in FIGS. 7A and 7B, the flash memory device may generate voltage revision values a1 through a6 and b1 through b5, each of which has a negative value, after executing each of the program loops L1 through L6. The flash memory device may control or determine the program loop in which revision of the program voltage begins. According to an embodiment illustrated in FIG. 7A, the program voltage is revised in the second program loop L2. However, in FIG. 7B the program voltage of each of the third program loop L3 through the seventh program loop L7 may be revised, starting by adding the voltage revision value of b1 to a preset third program voltage of the third program loop L3.

Figure 7C:
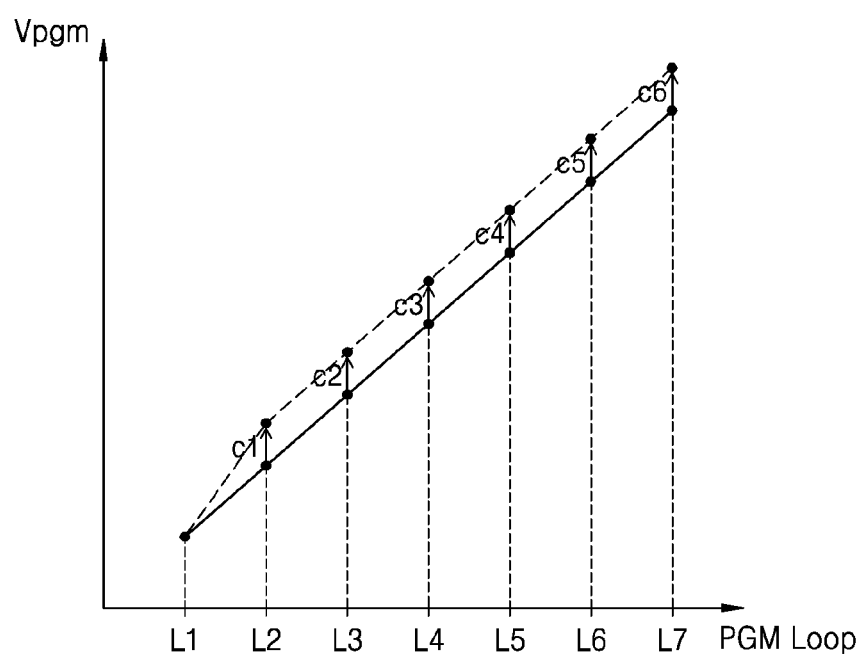
Figure 7D:
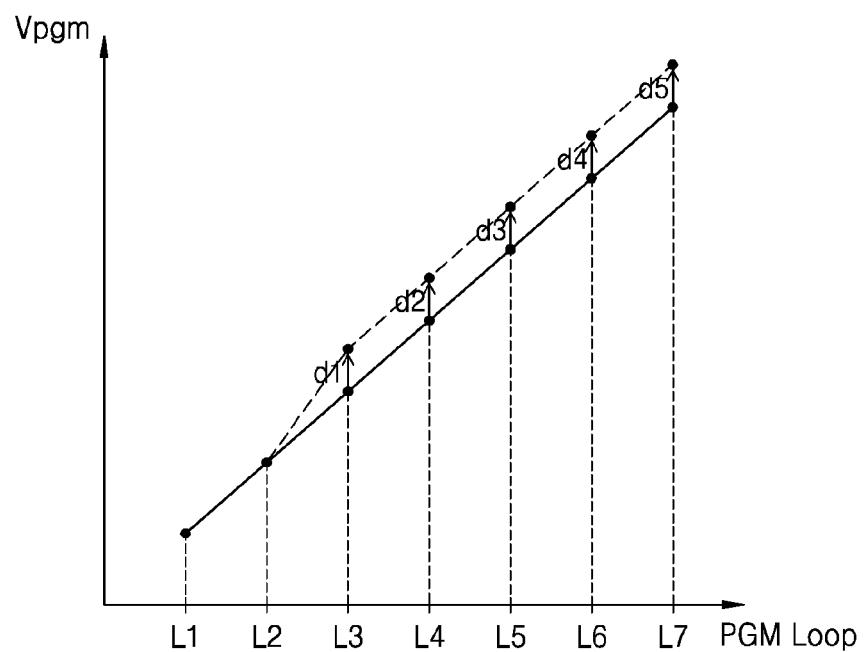

As illustrated in FIGS. 7C and 7D, the flash memory device may generate voltage revision values c1 through c6, and d1 through d5, respectively, each of which has a positive value, after executing each of the program loops L1 through L6. Again, the flash memory device may control the program loop in which revision of the program voltage begins. According to an embodiment illustrated in FIG. 7C, the program voltage is revised in the second program loop L2, while in FIG. 7D the program voltage of each of the third program loop L3 through the seventh program loop L7 may be revised, starting by adding the voltage revision value of d1 to the third program voltage of the third program loop L3.

Figure 7E:
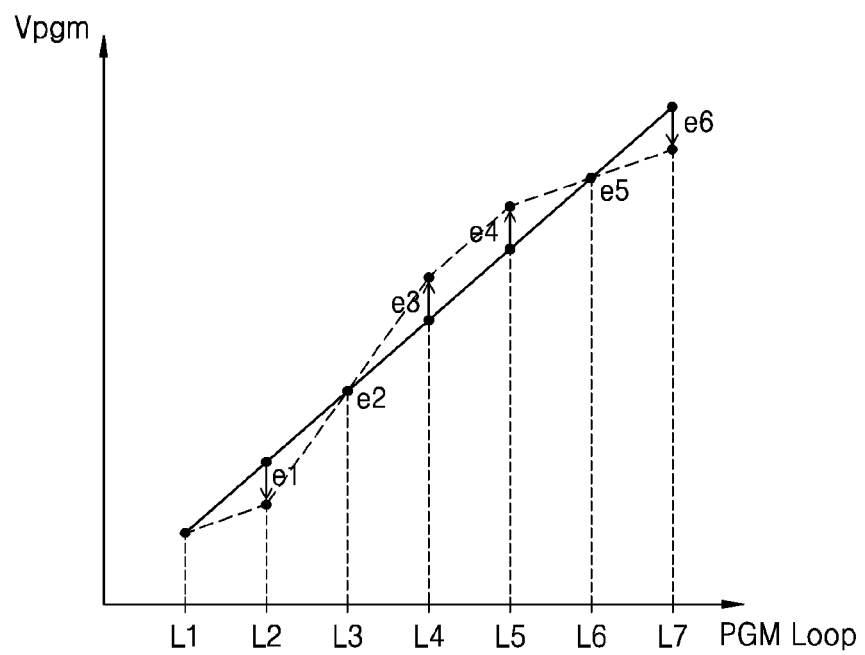

As illustrated in FIG. 7E, the flash memory device may generate voltage revision values e1 through e6 each having a positive value, a negative value, or a value of 0 after executing each of the program loops L1 through L6. However, this is only an example embodiment. Voltage revision values having various values may be generated, and thus, program voltages of the plurality of program loops may be revised by using various voltage revision values.

Figure 8A:
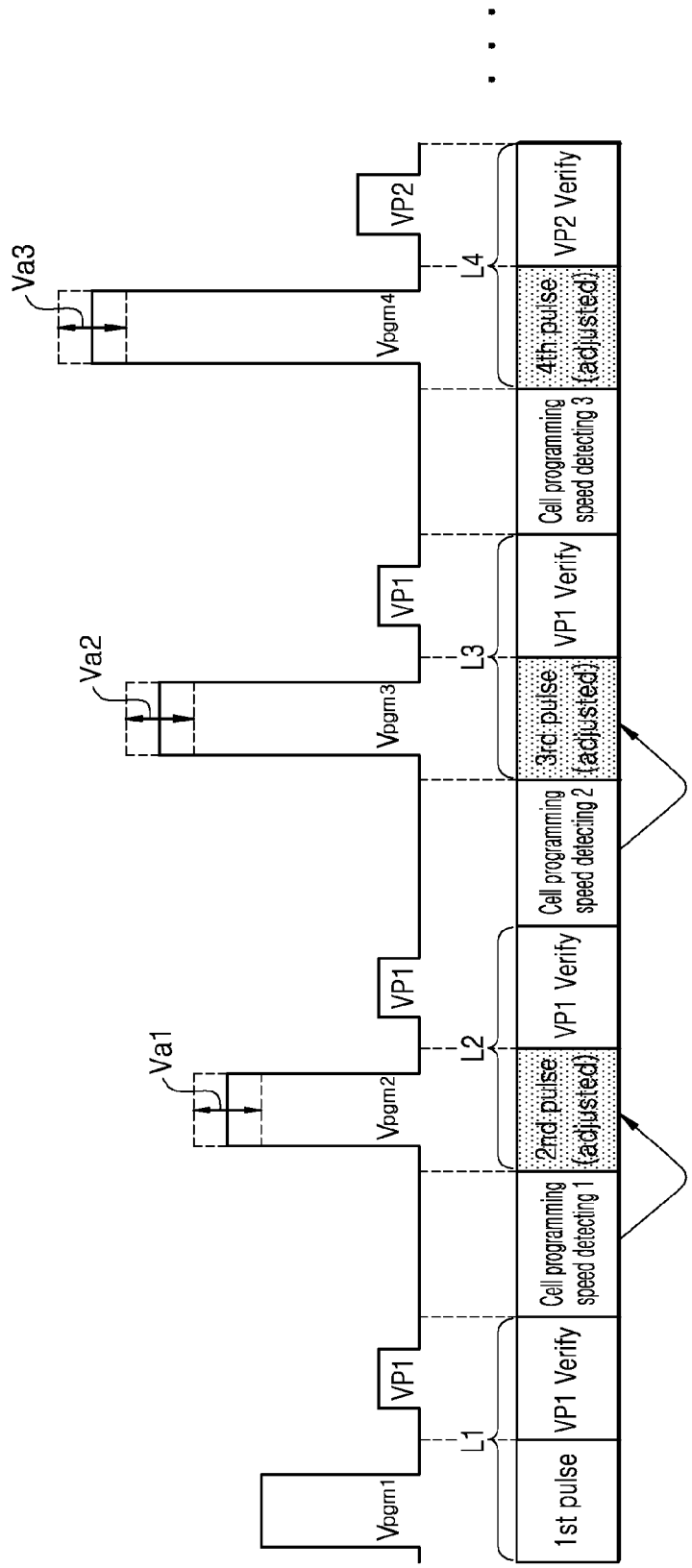
FIGS. 8A and 8B are views for describing example embodiments of a cell programming speed detection timing of a cell programming speed detection unit.
Figure 8B:
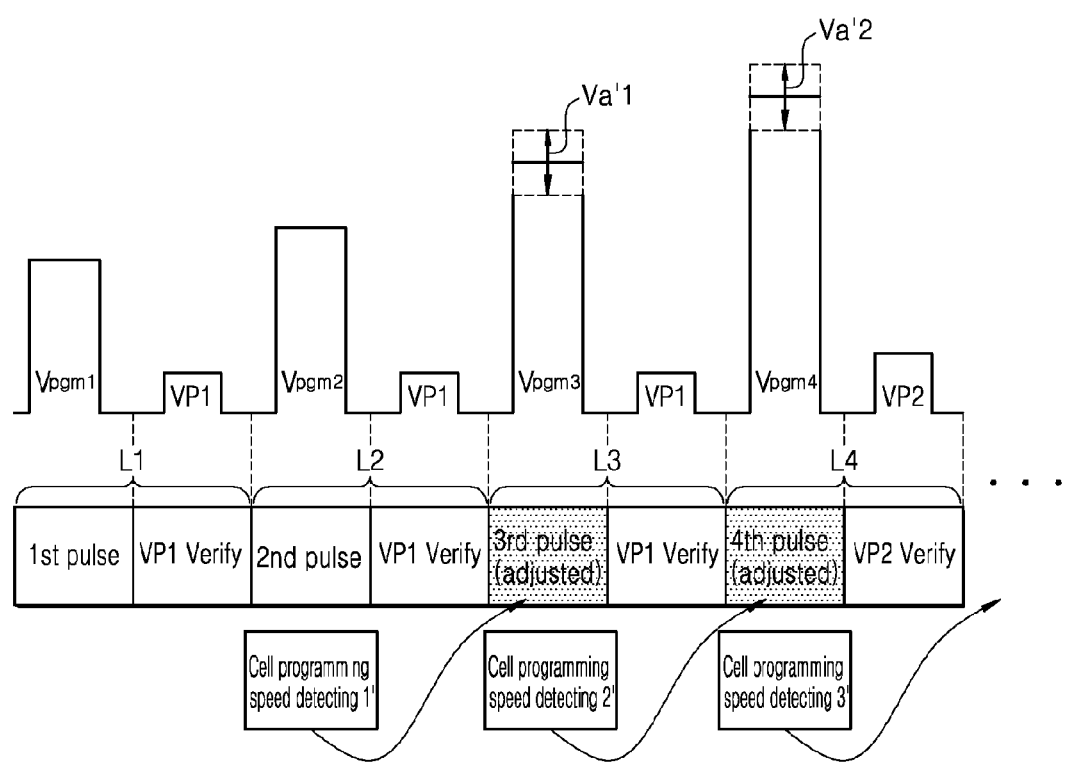

FIGS. 8A and 8B are views for describing example embodiments of a cell programming speed detection timing of cell programming speed detection unit 230.

As illustrated in FIG. 8A, the program loop operation and the cell programming speed detection operation may be serially, that is, sequentially, performed. For example, a first cell programming speed detection operation Cell programming speed detection 1 may be performed after the first program loop L1 is executed. That is, the first cell programming speed detection operation Cell programming speed detection 1 including an operation of counting the number of memory cells having a threshold voltage which is greater than or equal to the first program verify voltage VP1, by using the first program verify voltage VP1, may be performed after the first program loop L1 is executed. A voltage revision value Va1 with respect to the second program voltage Vpgm2 may be generated based on a result of the counting using the first program verify voltage VP1 and an operational condition of the first program loop L1. Also, a second cell programming speed detection operation Cell programming speed detection 2 may be performed after the second program loop L2 is executed, and a third cell programming speed detection operation Cell programming speed detection 3 may be performed after the third program loop L3 is executed. According to this method, an $N^{th}$ voltage revision value generated after an $N^{th}$ program loop is executed may be added to an $(N+1)^{th}$ preset program voltage when an $N+1^{th}$ program loop is executed after the $N^{th}$ program loop is executed. Thus, since the generated voltage revision value is added to the program voltage of the program loop that is executed after the voltage revision value is generated, instant revision of the program voltage may become possible.

As illustrated in FIG. 8B, the program loop operation and the cell programming speed detection operation may be simultaneously performed. For example, as illustrated in FIG. 8A, the second program loop L2 may not be stopped until the first cell programming speed detection operation Cell programming speed detection 1 is completed, and the first cell programming speed detection operation Cell programming speed detection 1' may be performed simultaneously when the second program loop L2 is executed. That is, the first cell programming speed detection operation Cell programming speed detection 1' including the operation of counting the number of memory cells having the threshold voltage which is greater than or equal to the first program verify voltage VP1 by using the first program verify voltage VP1 may be simultaneously performed when the second program loop L2 is executed. A voltage revision value Va'1 with respect to the third program voltage Vpgm3 may be generated based on a result of the counting using the first program verify voltage VP1 and an operational condition of the first program loop L1. Also, the third program loop L3 and the second cell programming speed detection operation Cell programming speed detection 2' may be simultaneously performed. The third cell programming speed detection operation Cell programming speed detection 3' may be performed simultaneously when the fourth program loop L4 is performed. According to this method, a delay of the execution of the program loop due to the cell programming speed detection operation may be prevented, and unnecessarily consumed time may be reduced.

Figure 9:
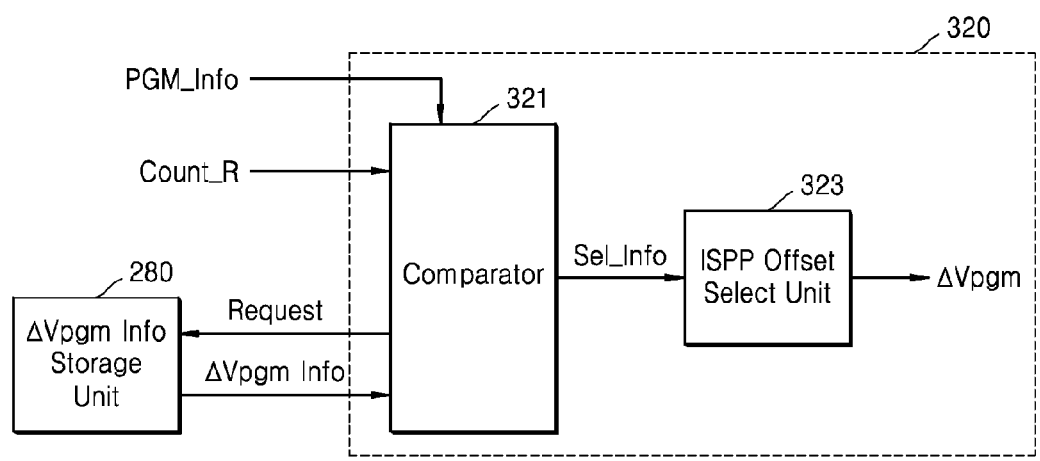
FIG. 9 is a block diagram of an embodiment of control logic.

FIG. 9 is a block diagram of an embodiment of control logic 320. Control logic 320 may be one embodiment of control logic 220 of FIG. 3.

As illustrated in FIG. 9, control logic 320 includes a comparison unit, or comparator, 321 and an ISPP offset selection unit 323. For convenience of explanation, voltage revision value-related information storage unit 280 is illustrated together with control logic 320. Comparison unit 321 may receive a count result Count_R and information of an operation condition of a program loop PGM_Info from the outside of control logic 320. The count result Count_R may be data generated by a cell programming speed detection unit (e.g., cell programming speed detection unit 230 of FIG. 3), and the information of the operational condition of the program loop PGM_Info may include at least one of: order information of the program loop, information about a temperature when the program loop is executed, an object word line information of the program loop, and information of a program/erase cycle with respect to the object word line or a block including the object word line, when executing the program loop corresponding to the count result Count_R.

Comparison unit 321 may issue a request for the voltage revision value-related information to voltage revision value storage unit 280. Voltage revision value-related information storage unit 280 may provide the voltage revision value-related information ΔVpgm Info to comparison unit 321 in response to the request. Comparison unit 321 may extract the voltage revision value ΔVpgm corresponding to the received count result Count_R and the information PGM_Info of the operational condition of the program loop from the voltage revision value-related information ΔVpgm Info.

According to an embodiment, comparison unit 321 may provide selection information Sel_Info to ISPP offset selection unit 323 to generate the voltage revision value ΔVpgm. ISPP offset selection unit 323 may include an E-fuse region including a plurality of E-fuses. Comparison unit 321 may select at least one E-fuse through the selection information Sel_Info and control ISPP offset selection unit 323 to generate the voltage revision value ΔVpgm corresponding to the received count result Count_R and the information PGM_Info of the operational condition of the program loop. However, this is merely an example embodiment. Comparison unit 321 may generate the voltage revision value ΔVpgm. Further, comparison unit 321 may perform an operation of adding the voltage revision value ΔVpgm to a preset program voltage that is to be revised.

Figure 10:
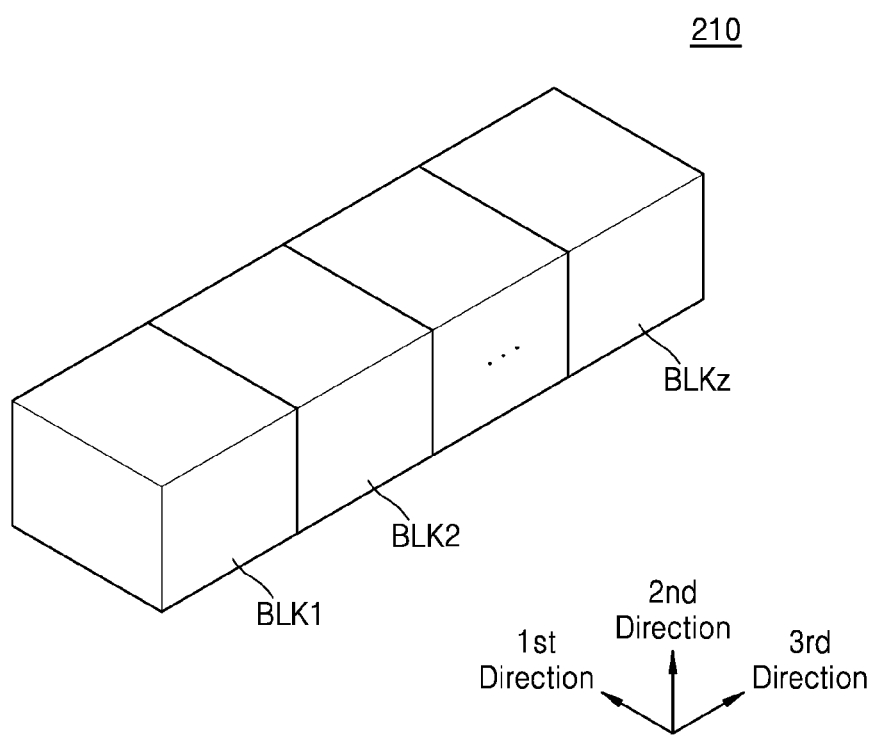
FIG. 10 is a block diagram of an example embodiment of a memory cell array which may be included in a memory device of FIG. 1.

FIG. 10 is a block diagram of an example embodiment of memory cell array 210 which may be included in memory device 200 of FIG. 1.

As illustrated in FIG. 10, memory cell array 210 may include 3D (or vertical) NAND (VNAND) memory cells.

Referring to FIG. 10, memory cell array 210 includes a plurality of blocks BLK1 through BLKz. Each of the blocks BLK1 through BLKz may have a 3D structure (a vertical structure). In detail, each of the blocks BLK1 through BLKz includes structures extending in first through third directions. For example, each block includes a plurality of strings or NAND strings extending in the second direction. Here, the plurality of strings may be provided to be spaced apart from each other by a certain distance in the first and third directions.

The blocks BLK1 through BLKz may be selected by address decoder 240 illustrated in FIG. 3. Each of the blocks BLK1 through BLKz is connected to a plurality of bit lines BLs, a plurality of string selection lines SSLs, a plurality of word lines WLs, a ground selection line GSL, and a common source line CSL. An example of each of the blocks BLK1 through BLKz will be described in more detail with reference to FIG. 11.

Figure 11:
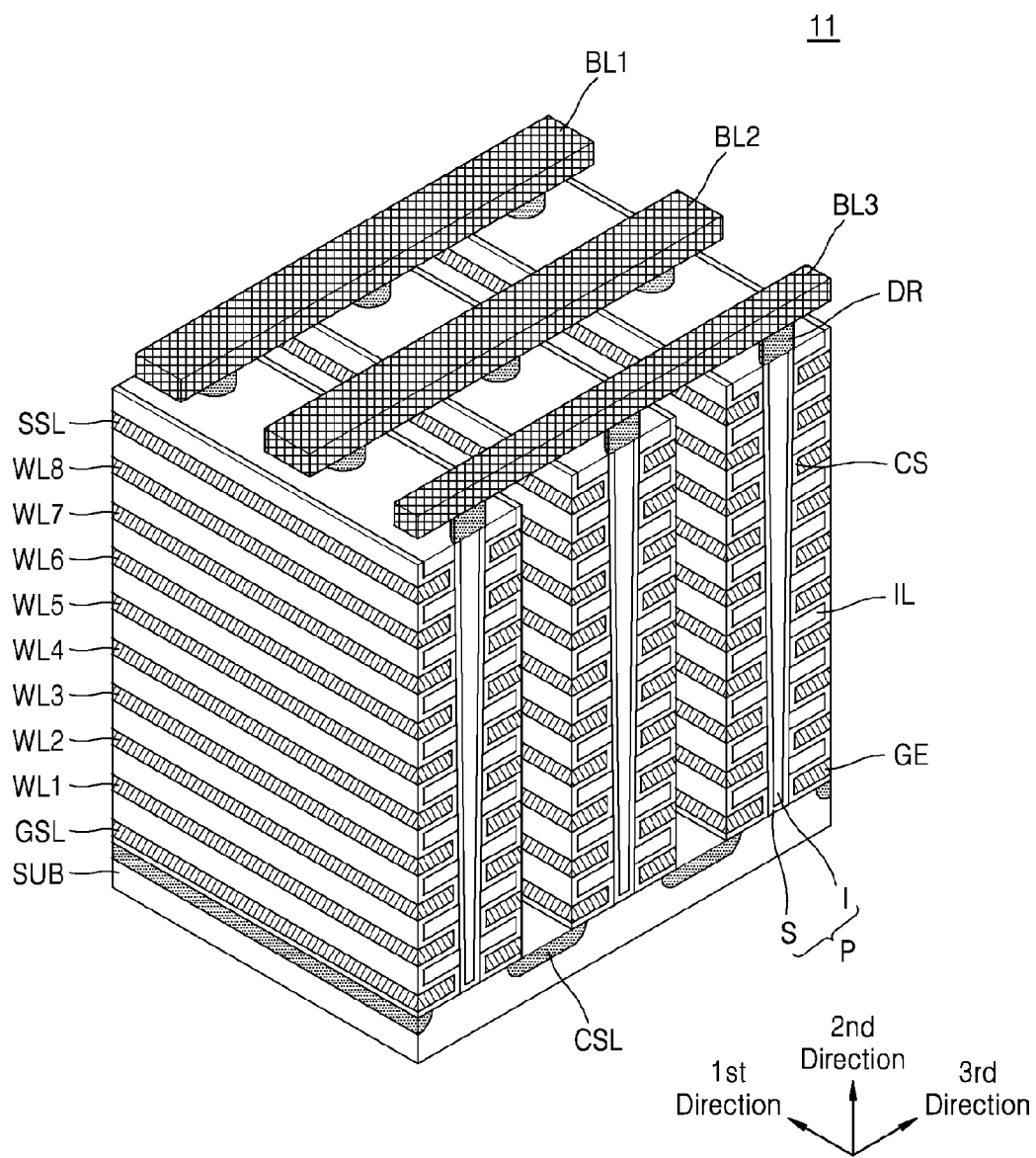
FIG. 11 is a perspective view of an example of a first block of the blocks of the memory cell array of FIG. 10.

FIG. 11 is a perspective view of an example of the first block BLK1 of the plurality of blocks BLK1 through BLKz of memory cell array 210 of FIG. 10.

Referring to FIG. 11, the first memory block BLK1 is formed in a direction perpendicular to a substrate SUB. In FIG. 11, it is illustrated that the first block BLK1 includes two selection lines GSL and SSL, eight word lines WL1, WL2, WL3, WL4, WL5, WL6, WL7 and WL8, and three bit lines BL1, BL2, and BL3. However, the first block BLK1 may include more or less selection lines, word lines, and bit lines than the illustrated selection lines, word lines, and bit lines.

The substrate SUB has a first conductive type (for example, a p-type), and the common source line CSL extending in the first direction and doped with second conductive-type (for example, n-type) impurities are provided on the substrate SUB. A plurality of insulating layers ILs extending in the first direction are sequentially provided on the substrate SUB in the second direction between an adjacent pair of common source lines CSL, and the plurality of insulating layers ILs are spaced apart from each other by a certain distance in the second direction. The plurality of insulating layers ILs may include, for example, an insulating material, such as a silicon oxide.

A plurality of pillars Ps are sequentially provided on the substrate SUB in the first direction between a pair of adjacent common source lines CSLs to penetrate the plurality of insulating layers ILs in the second direction. For example, the plurality of pillars Ps may penetrate the plurality of insulating layers ILs to contact the substrate SUB. In detail, a surface layer S of each pillar P may include a silicon material having the first type and function as a channel region. Meanwhile, an internal portion I of each pillar P may include an insulating material such as a silicon oxide or an air gap.

A charge storage layer CS is provided between a pair of adjacent common source lines CSLs along exposed surfaces of the insulating layers ILs, the pillars Ps, and the substrate SUB. For example, the charge storage layer CS may have an oxide-nitride-oxide (ONO) structure. Also, a gate electrode GE is provided on an exposed surface of the charge storage layer CS between the pair of adjacent common source lines CSLs.

Drains DRs are provided on the plurality of pillars Ps, respectively. For example, the drains DRs may include a silicon material doped with second conductive type impurities. Bit lines BLs are provided on the drains DRs to extend in the third direction and to be spaced apart from each other by a certain distance in the first direction.

Figure 12:
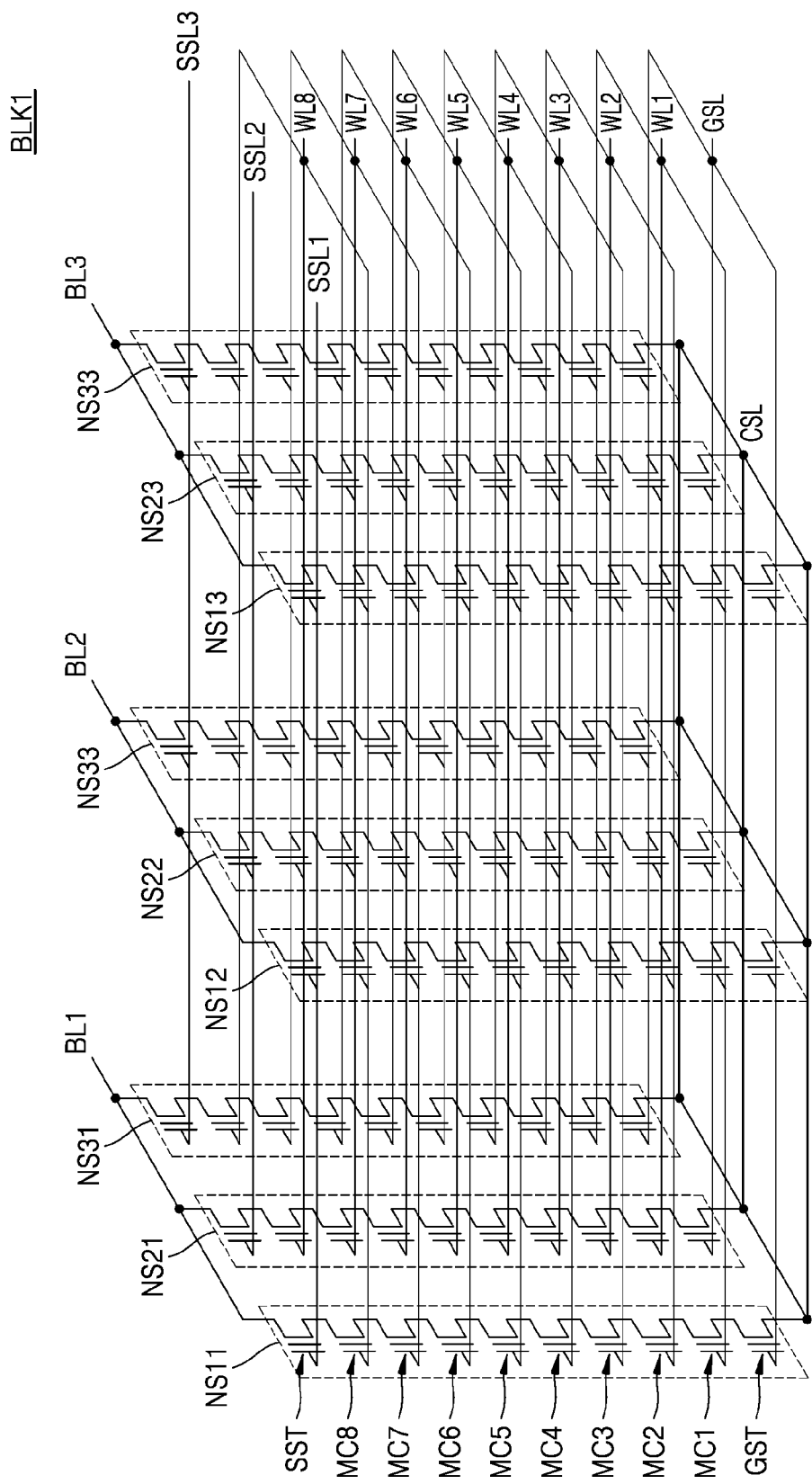
FIG. 12 is a circuit diagram of an equivalent circuit of the first block of FIG. 11.

FIG. 12 is a circuit diagram of an equivalent circuit of the first block BLK1 of FIG. 11.

Referring to FIG. 12, the first block BLK1 may be a vertical structure NAND flash memory, and each of the blocks BLK1 through BLKz illustrated in FIG. 10 may be realized as illustrated in FIG. 12. The first block BLK1 may include a plurality of NAND strings NS11 through NS33, a plurality of word lines WL1 through WL8, a plurality of bit lines BL1 through BL3, a ground selection line GSL, a plurality of string selection lines SSL1 through SSL3, and a common source line CSL. Here, the number of NAND strings, the number of word lines, the number of bit lines, the number of ground selection lines, and the number of string selection lines may vary according to embodiments.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each NAND string (for example, NS11) may include a string selection transistor SST, a plurality of memory cells MC1, MC2, MC3, MC4, MC5, MC6, MC7, and MC8, and a ground selection transistor GST serially connected to one another. Hereinafter, for convenience, the NAND string will be referred to as a string.

The strings commonly connected to one bit line forms a column. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

The strings commonly connected to one string selection line forms a row (or a page). For example, the strings NS11, NS12, and NS13 commonly connected to the first string selection line SSL1 may correspond to a first row, the strings NS21, NS22, and NS23 commonly connected to the second string selection line SSL2 may correspond to a second row, and the strings NS31, NS32, and NS33 commonly connected to the third string selection line SSL3 may correspond to a third row.

The string selection transistor SST is connected to the string selection lines SSL1 through SSL3. The plurality of memory cells MC1 through MC8 are respectively connected to the corresponding word lines WL1 through WL8. The ground selection transistor GST is connected to the ground selection line GSL. The string selection transistor SST is connected to a corresponding bit line BL, and the ground selection transistor GST is connected to the common source line CSL.

The word lines (for example, WL1) having the same heights are commonly connected, and the string selection lines SSL1 through SSL3 are separated from one another.

Figure 13:
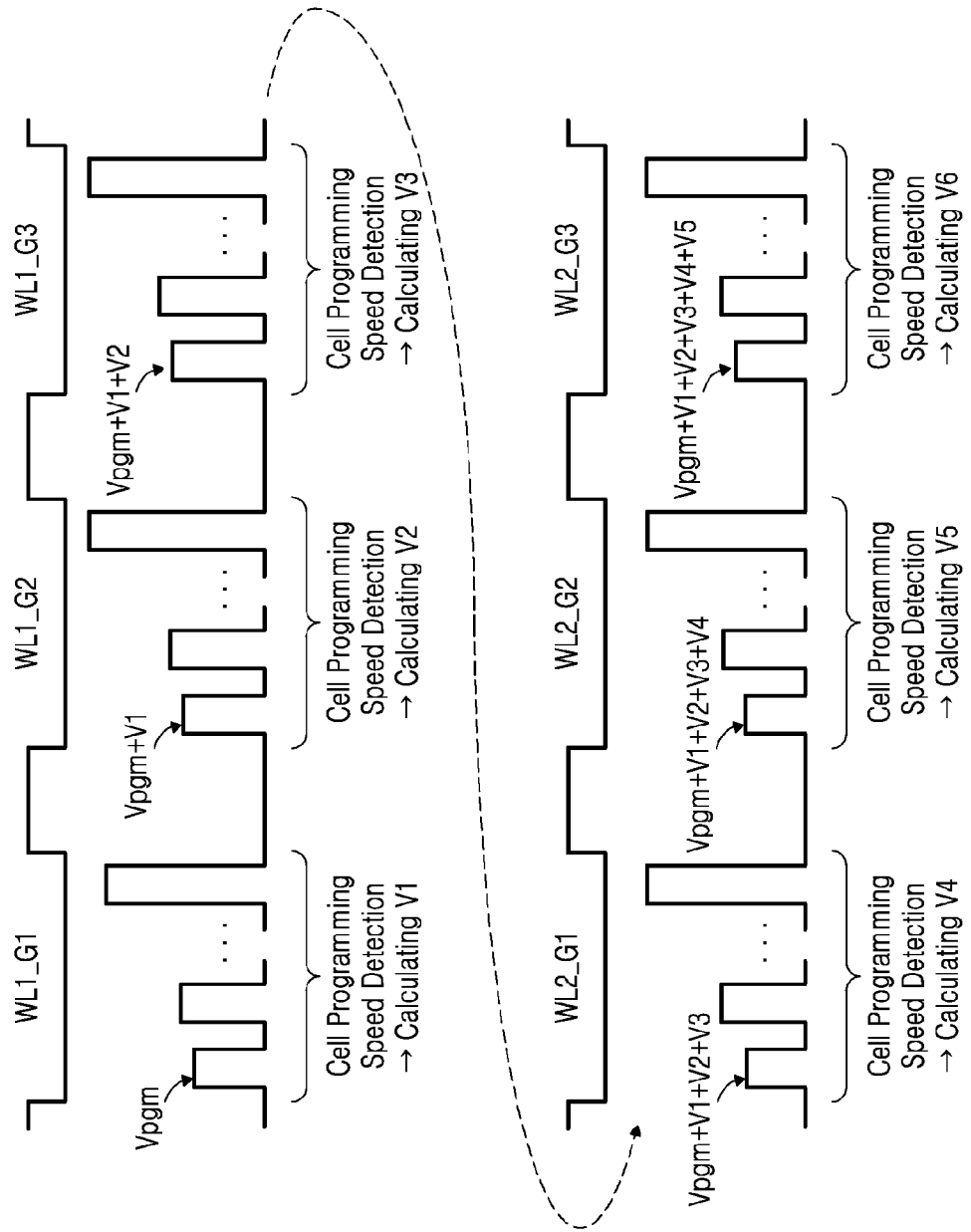
FIG. 13 is a view for describing an embodiment of a method of programming a three-dimensional (3D) memory device according to an embodiment.

FIG. 13 is a view for describing an embodiment of a method of programming a 3D memory device.

As illustrated in FIGS. 12 and 13, when a program operation is performed with respect to the first word line WL1, a program operation may be performed with respect to each of a first memory cell group WL1_G1 of the first word line WL1 through a third memory cell group WL1_G3 of the first word line WL1. However, this is merely an example embodiment, and a plurality of memory cell groups including a plurality of memory cells may be connected to each of the word lines WL1 through WL8. However, hereinafter, descriptions will be given by focusing on the equivalent circuit of FIG. 12.

The memory cell groups of the first word line WL1 may be divided or separated by the string selection lines SSL1 through SSL3. The memory cells included in the first memory cell group WL1_G1 of the first word line WL1 may be connected to the first string selection line SSL1, the memory cells included in the second memory cell group WL1_G2 of the first word line WL1 may be connected to the second string selection line SSL2, and the memory cells included in the third memory cell group WL1_G3 of the first word line WL1 may be connected to the third string selection line SSL3. According to an embodiment, the program operations may be sequentially performed in order of the first memory cell group WL1_G1, the second memory cell group WL1_G2, and the third memory cell group WL1_G3 of the first word line WL1.

Referring to FIG. 13, the 3D memory device may first execute a plurality of program loops with respect to the first memory cell group WL1_G1 of the first word line WL1. Here, a program start voltage Vpgm may correspond to a voltage level that is pre-set. The first memory cell group WL1_G1 of the first word line WL1 may execute the plurality of program loops using preset or "nominal" program voltages for the program loops, and by performing a plurality of cell programming speed detection operations may generate a plurality of voltage revision values a1 through a6, as described in FIG. 7A. Here, the 3D memory device may generate a first revision value V1 of the first memory cell group WL1_G1 from the plurality of voltage revision values a1 through a6. According to an embodiment, the 3D memory device may use an average value of the plurality of voltage revision values a1 through a6 to generate the first revision value V1 of the first memory cell group WL1_G1, or may use the voltage revision value a6 of a last program loop (for example, the seventh program loop L7 of FIG. 7A) of the plurality of program loops to generate the revision value V1 of the first memory cell group WL1_G1. However, it is not limited thereto, and the first revision value V1 of the first memory cell group WL1_G1 may be generated by using various methods including a method of using an average value of the plurality of voltage revision values a1 through a6 excluding a largest value and a smallest value.

The 3D memory device may add the generated first revision value V1 of the first memory cell group WL1_G1 to each of the preset or "nominal" program voltages for executing the plurality of program loops with respect to the second memory cell group WL1_G2 of the first word line WL1 adjacent to the first memory cell group WL1_G1 of the first word line WL1 to produce corresponding adjusted program voltages. Thus, when the first program loop with respect to the second memory cell group WL1_G2 of the first word line WL1 is executed, the adjusted program start voltage may have a level of Vpgm+V1.

By using this method, the 3D memory device may generate a second revision value V2 of the second memory cell group WL1_G2, from the plurality of voltage revision values added to the preset or "nominal" program voltages for executing the plurality of program loops with respect to the second memory cell group WL1_G2 of the first word line WL1 and performing the counting operation. The 3D memory device may add the generated second revision value V2 of the second memory cell group WL1_G2 to each of the preset or "nominal" program voltages and the first revision value V1 for executing the plurality of program loops with respect to the third memory cell group WL1_G3 of the first word line WL1 adjacent to the second memory cell group WL1_G2 of the first word line WL1. Thus, when the first program loop with respect to the third memory cell group WL1_G3 of the first word line WL1 is executed, the adjusted program start voltage may have a level of Vpgm+V1+V2. Also, the 3D memory device may generate a third revision value V3 of the third memory cell group WL1_G3, by using the plurality of voltage revision values added to the preset or "nominal" program voltages and the first and second revision values V1 and V2 for executing the plurality of program loops with respect to the third memory cell group WL1_G3 of the first word line WL1. By this method, a revision value of each of the memory cell groups of one word line may be accumulated.

Also, the 3D memory device may generate revision values of the word lines WL2 through WL8 by using the first through third revision values V1 through V3 of the plurality of memory cell groups WL1_G1 through WL1_G3 generated while the program loops with respect to the first memory cell group WL1_G1 through the third memory cell group WL1_G3 of the first word line WL1 are executed. According to an embodiment, the 3D memory device may generate the revision values of the word lines WL2 through WL8 by using a summation of the revision values V1 through V3 of the first memory cell group WL1_G1 through the third memory cell group WL1_G3. However, this is merely an example embodiment, and the 3D memory device may generate the revision values of the word lines WL2 through WL8 by using an average value of the revision values V1 through V3 of the first memory cell group WL1_G1 through the third memory cell group WL1_G3. That is, the 3D memory device may generate the revision values of the word lines WL1 through WL8 by using various methods.

When the revision values of the word lines WL2 through WL8 have a level of V1+V2+V3, the 3D memory device may add the generated revision values of the word lines WL2 through WL8 to each of preset program voltages when program operations are performed with respect to the memory cell groups WL2_G1 through WL2_G3 of the second word line WL2 located in the same block as the first word line WL1 to be adjacent to the first word line WL1. Thus, when a first program loop with respect to the second memory cell group WL2_G1 of the second word line WL2 is executed, a program start voltage may have a level of Vpgm+V1+V2+V3. However, when the program operation is performed with respect to the word lines located in another block, the voltage revision value, the revision values of the memory cell groups, the revision values of the word lines, etc. may be re-set, and the voltage revision value, the revision values of the memory cell groups, and the revision values of the word lines related to the program operation with respect to the word lines located in the other block may be re-generated.

As shown above, when the program operation is performed in a unit of a memory cell group of one word line by the 3D memory device, the revision values of the memory cell groups are accumulated, and when the program operation is performed with respect to adjacent word lines, the revision values of the word lines are accumulated. Thus, more precise and rapid revision with respect to the program voltage may be possible.

FIG. 14 is a view for describing a method of generating a revision value of the word lines, via a 3D memory device, according to an embodiment.

As illustrated in FIG. 14, in (a) of FIG. 14, the added value of the revision values V1 through V3 of the first through third memory cell groups WL1_G1 through WL1_G3, which are generated during the program operation with respect to the first through third memory cell groups WL1_G1 through WL1_G3 of the first word line WL1, may be generated as the revision value V1+V2+V3 of the word lines, as described in FIG. 13. The generated revision value V1+V2+V3 of the word lines may be added to each of program voltages when program operations are performed with respect to the first through third memory cell groups WL2_G1 through WL2_G3 of the second word line WL2 located in the same block as the first word line WL1 to be adjacent to the first word line WL1. By using this method, the revision values of the plurality of word lines which are in the same block and adjacent to each other may be accumulated.

In (b) of FIG. 14, unlike in (a) of FIG. 14, a sum of a revision value Va of additional word lines and the revision value V1+V2+V3 of the previous word line may be added to each of program voltages when the program operation is performed with respect to the first through third memory cell groups WL2_G1 through WL2_G3 of the second word line WL2, by considering a characteristic of the second word line WL2, which is different from that of the first word line WL1.

In (c) of FIG. 14, the program operation may be performed by accumulating the revision values V1 and V2 of the memory cell groups of the first word line WL1 and the revision values V3 and V4 of the memory cell groups of the second word line WL2, without considering the revision values of other word lines.

In (d) of FIG. 14, the revision value Va of the word lines may be set and added to each of program voltages when the program operation is performed with respect to the first through third memory cell groups WL2_G1 through WL2_G3 of the second word line WL2, by considering characteristics of the memory cells connected to the second word line WL2 and the first word line WL1. The generated revision values of the memory cell groups, and the generated or set revision value Va of the word lines may be stored in the register Reg of the control logic 220 of FIG. 3, or may be stored or set in the voltage revision value-related information storage unit 280.

Figure 15:
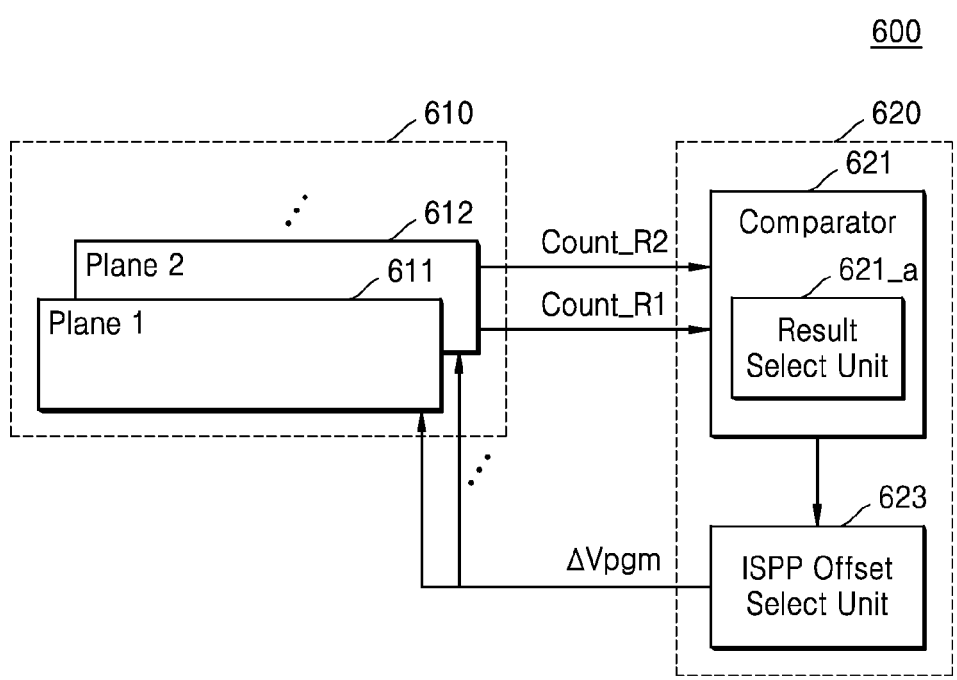
FIG. 15 is a view for describing a method of programming an embodiment of a flash memory device.

FIG. 15 is a view for describing a method of programming an embodiment of a flash memory device 600.

As illustrated in FIG. 15, flash memory device 600 includes a memory cell array 610 and control logic 620. Memory cell array 610 includes a first plane 611 and a second plane 612 including a plurality of blocks. Control logic 620 includes a comparison unit 621 and an ISPP offset selection unit 623. According to an embodiment, program operations may be simultaneously performed with respect to first plane 611 and second plane 612. Also, in order to revise a program voltage when the program operations are performed with respect to first plane 611 and second plane 612, an operation of detecting a programming speed of memory cells connected to selected word lines corresponding to first plane 611 and second plane 612 may be performed. As described above, comparison unit 621 may receive first counting information Count_R1 and second counting information Count_R2 from first plane 611 and second plane 612, respectively. Comparison unit 621 may include a result selection unit 621_a, and result selection unit 621_a may select any one of the first counting information Count_R1 and the second counting information Count_R2. According to an embodiment, result selection unit 621_a may select whichever of the first counting information Count_R1 and the second counting information Count_R2 that has a larger value. However, this is only an example embodiment. In other embodiments, result selection unit 621_a may select the counting information having the smaller value. Result selection unit 621_a may select the counting information through various methods.

Comparison unit 621 may control ISPP offset selection unit 623 in order to generate a voltage revision value ΔVpgm based on the first counting information Count_R1 and an operational condition of a program loop of first plane 611. Control logic 620 may perform a program operation with respect to first plane 611 and second plane 612 by using the voltage revision value ΔVpgm.

Figure 16:
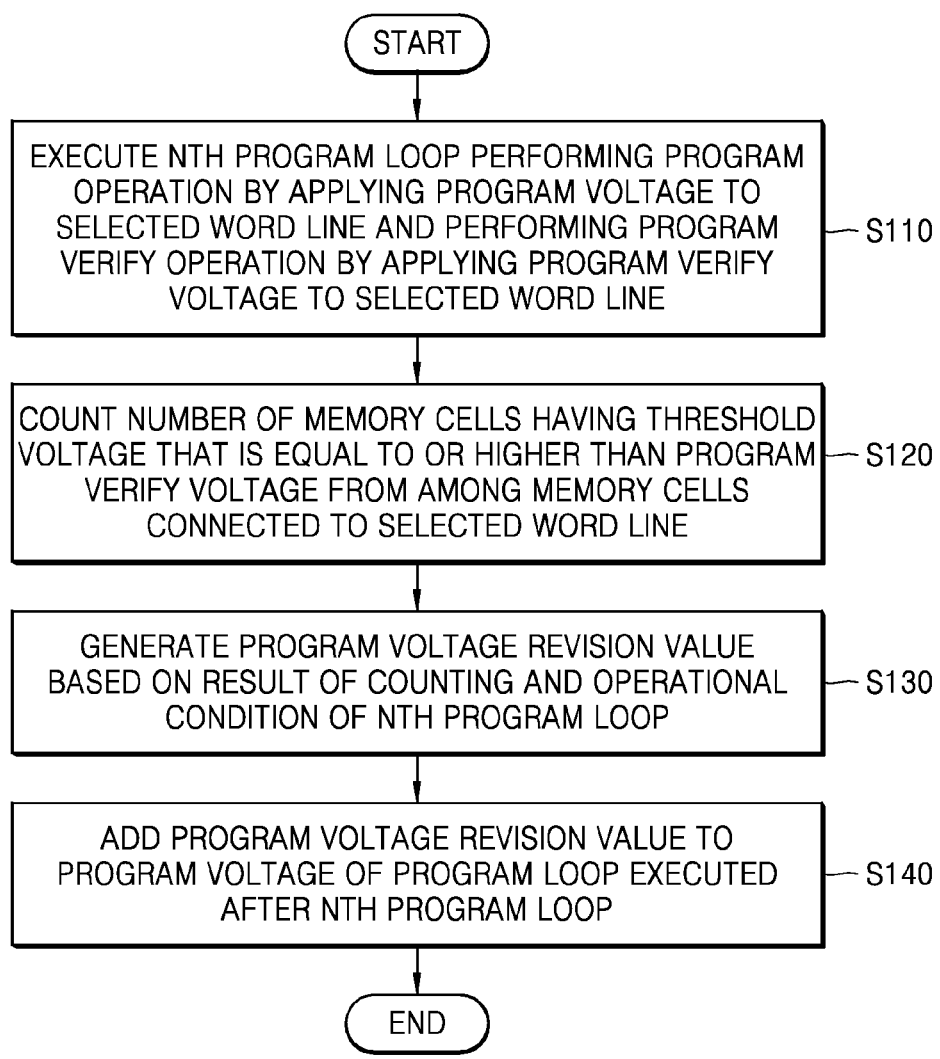
FIG. 16 is a flowchart of an embodiment of a method of programming a flash memory device.

FIG. 16 is a flowchart of an embodiment of a method of programming a flash memory device.

As illustrated in FIG. 16, in operation S110 an $N^{th}$ program loop in which a program operation is performed by applying an Nth program voltage to a selected word line and a program verify operation is performed by applying a program verify voltage to the selected word line, is executed. In operation S120, a programming speed of memory cells is detected by counting the number of memory cells having a threshold voltage which is greater than or equal to the program verify voltage, from among the memory cells connected to the selected word line. In operation S130 program voltage revision value is generated based on a result of the counting and an operational condition of the $N^{th}$ program loop. In operation S140, the voltage revision value is added to a "nominal" program voltage (which, for example, may be preset or stored in memory) of a program loop that is executed after the $N^{th}$ program loop, for example an $M^{th}$ preset program voltage for an $M^{th}$ program loop, where M>N.

Figure 17:
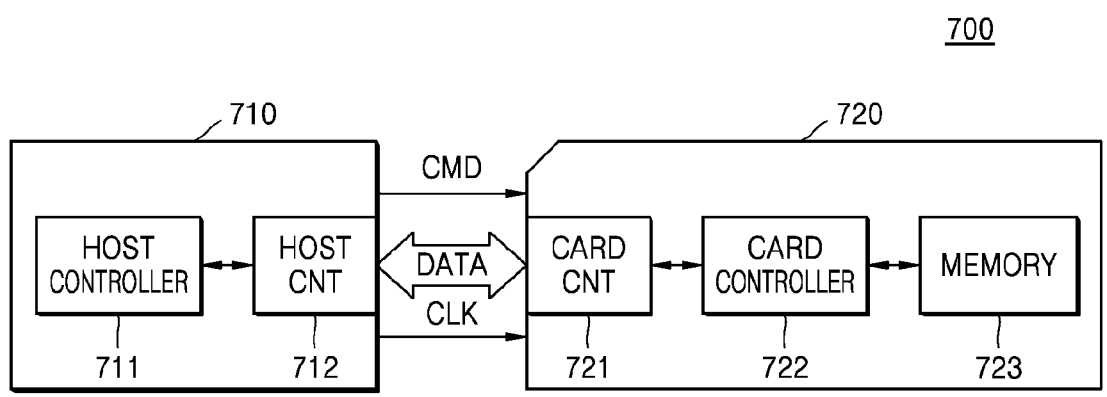
FIG. 17 is a block diagram of an example in which a memory system is applied to an embodiment of a memory card system.

FIG. 17 is a block diagram of an example in which a memory system 723 is applied to an embodiment of a memory card system 700. Memory system 723 is assumed to be a flash memory system.

Referring to FIG. 17, memory card system 700 may include a host 710 and a memory card 720. Host 710 may include a host controller 711 and a host contact unit 712. Memory card 720 may include a card contact unit 721, a card controller 722, and memory system 723. Here, memory system 723 may be realized by using the embodiments illustrated in FIGS. 1 through 17 and described above. Accordingly, memory system 723 may include a memory controller and a flash memory device. Also, memory system 723 may revise a program voltage based on a programming speed of memory cells which are to be programmed during a program operation.

Host 710 may write data to memory card 720 or read data stored in memory card 720. Host controller 711 may transmit a command CMD, a clock signal CLK generated in a clock generator in host 710, and data DATA to memory card 720 via host contact unit 712.

Card controller 722 may provide the data DATA to memory system 723, by synchronizing the data DATA with the clock signal CLK generated in the clock generator in card controller 722, in response to a request received via card contact unit 721. Memory system 723 may store the data DATA transmitted from host 710.

Memory card 720 may be realized as a compact flash card (CFC), a microdrive, a smart media card (SMC), a multimedia card (MMC), a security digital card (SDC), a universal flash memory device (UFS), a memory stick, a universal serial bus (USB) flash memory driver, etc.

Figure 18:
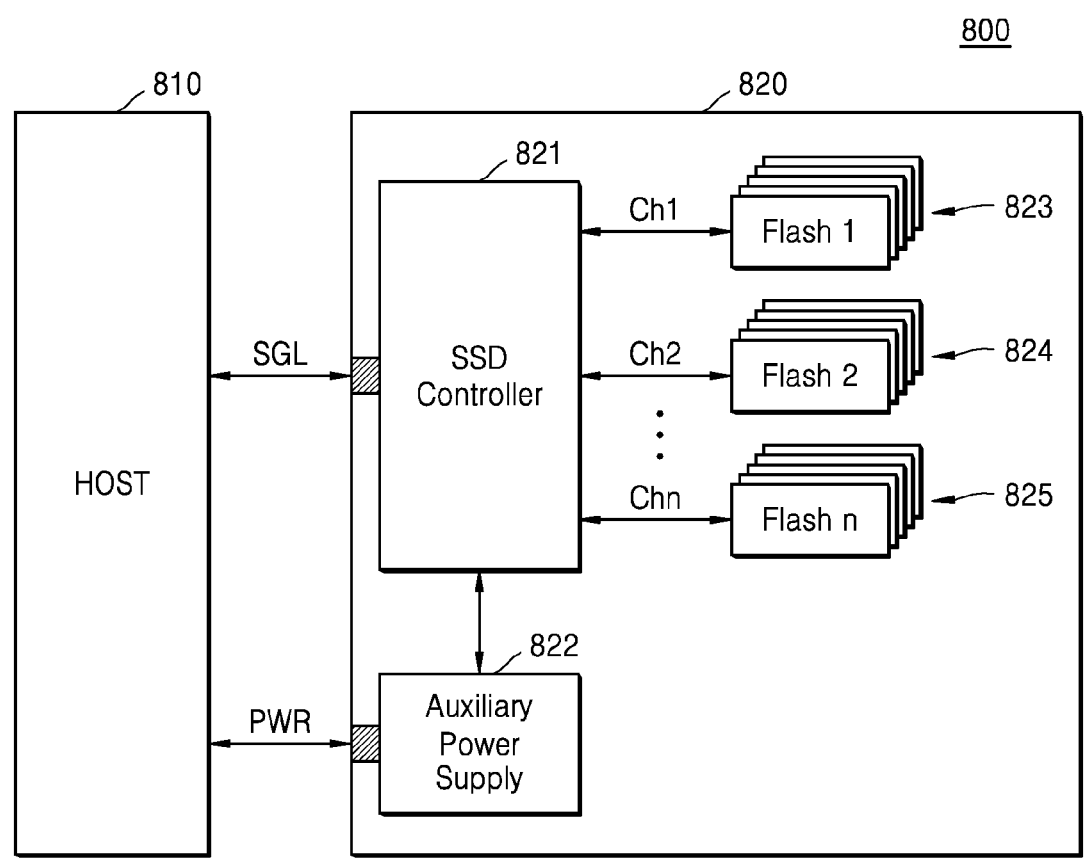
FIG. 18 is a block diagram of an example in which memory systems are applied to a an example embodiment of a solid state drive (SSD) system

FIG. 18 is a block diagram of an example in which memory systems 823, 824, and 825 are applied to an embodiment of a solid state drive (SSD) system 800.

Referring to FIG. 18, SSD system 800 may include a host 810, and a SSD 820. SSD 820 exchanges signals with host 810 via a signal connector and receives power via a power connector. SSD 820 may include a SSD controller 821, an auxiliary power device 822, and the plurality of memory systems 823, 824, and 825. Each of memory systems 823, 824, and 825 may include a memory controller and a flash memory device. According to an embodiment, memory systems 823, 824, and 825 may revise a program voltage based on a programming speed of memory cells which are to be programmed during a program operation.

Figure 19:
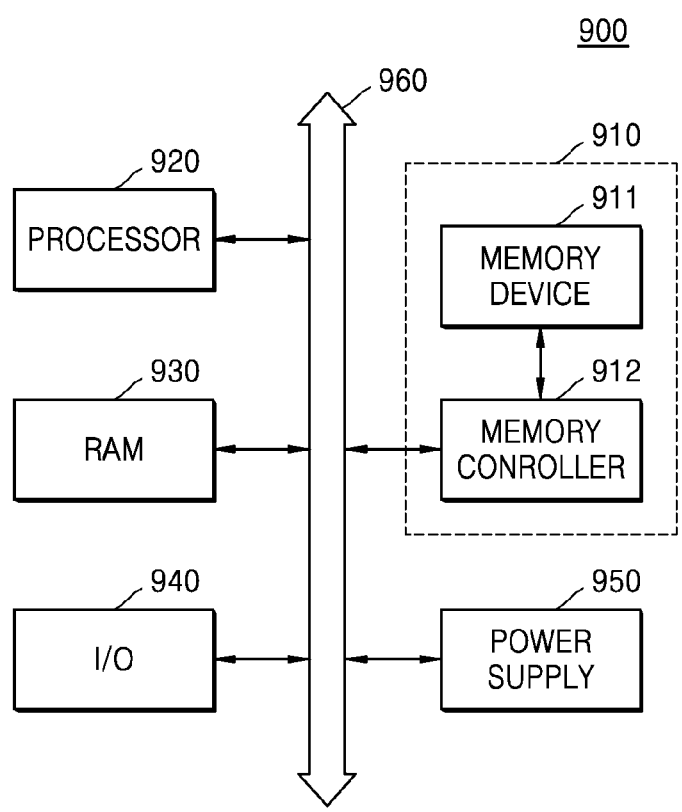
FIG. 19 is a block diagram of an embodiment of a computing system including a memory system.

FIG. 19 is a block diagram of an embodiment of a computing system 900 including a memory system 910.

Referring to FIG. 19, computing system 900 may include memory system 910, a processor 920, RAM 930, an input and output device 940, and a power device 950. Also, memory system 910 may include a memory device 911 and a memory controller 912. Meanwhile, although it is not illustrated in FIG. 20, computing system 900 may further include ports capable of communicating with a video card, a sound card, a memory card, a USB device, or other electronic devices. Computing system 900 may be realized as a personal computer (PC), or portable electronic devices, such as a notebook computer, a cellular phone, a personal digital assistant (PDA), and a camera.

Processor 920 may perform specific calculations or tasks. According to an embodiment, processor 920 may include a micro-processor or a central processing unit (CPU). Processor 920 may communicate with RAM 930, input and output device 940, and memory system 910 via a bus 960, such as an address bus, a control bus, and a data bus. Memory system 910 may be realized by using memory device 200 of the embodiments illustrated in FIGS. 1 through 17.

According to an embodiment, processor 920 may be connected to an extension bus, such as a peripheral component interconnect (PCI) bus.

RAM 930 may store data necessary for an operation of the computing system 900. RAM 930 may include DRAM, mobile DRAM, SRAM, PRAM, FRAM, MRAM, RRAM, or the like.

Input and output device 940 may include an input device, such as a keyboard, a keypad, a mouse, etc., and an output device, such as a printer, a display, etc. Power device 950 may supply an operation voltage necessary for the operation of the computing system 900.

While the inventive concept has been particularly shown and described with reference to exemplary embodiments thereof, it will be understood that various changes in form and details may be made therein without departing from the spirit and scope of the following claims.

What is claimed is:

1. A method of programming a flash memory device comprising a plurality of pages, the program method comprising:
   executing an $N^{th}$ program loop of a program operation by applying an $N^{th}$ program voltage to a selected word line from among the plurality of pages, and performing a program verify operation by applying a program verify voltage to the selected word line;
   counting a number of memory cells having a threshold voltage which is greater than or equal to the program verify voltage, from among memory cells connected to the selected word line;
   generating a voltage revision value based on a result of the counting and an operational condition of the $N^{th}$ program loop; and
   adding the voltage revision value to an $M^{th}$ preset program voltage of an $M^{th}$ program loop executed after the $N^{th}$ program loop.

2. The method of claim 1, wherein the voltage revision value is capable of having a negative value or a positive value based on the result of the counting and the operational condition of the $N^{th}$ program loop.

3. The method of claim 1, wherein the generating of the voltage revision value comprises selecting and referring to any one of a plurality of look-up tables comprising table information that is related to the result of the counting and the voltage revision value.

4. The method of claim 3, wherein the selecting and referring to any one of the plurality of look-up tables comprises selecting and referring to a look-up table corresponding to the operational condition of the $N^{th}$ program loop.

5. The method of claim 1, wherein the operational condition of the $N^{th}$ program loop comprises at least one of: order information of the $N^{th}$ program loop from among a plurality of program loops, information about a temperature of the flash memory device when the $N^{th}$ program loop is executed, object word line information of the $N^{th}$ program loop, and program/erase cycle information of the selected word line.

6. The method of claim 1, wherein the counting of the number of memory cells having the threshold voltage which is greater than or equal to the program verify voltage, from among the memory cells connected to the selected word line, comprises:
   ascertaining a number of memory cells having a threshold voltage which is greater than or equal to a low level program verify voltage which is less than the program verify voltage, from among the memory cells connected to the selected word line,
   wherein a result of the counting corresponds to the number of memory cells having the threshold voltage which is greater than or equal to the low level program verify voltage.

7. The method of claim 6, further comprising:
   counting a number of memory cells of an intermediate distribution area, the memory cells having a threshold voltage which is less than or equal to the program verify voltage and which is greater than or equal to the low level program verify voltage;
   generating a bit line voltage revision value applied to the memory cells of the intermediate distribution area, based on a result of counting the number of memory cells of the intermediate distribution area, and the operational condition of the $N^{th}$ program loop; and
   adding the bit line voltage revision value to a preset bit line voltage applied to the memory cells of an intermediate distribution area of another program loop that is different from the $N^{th}$ program loop.

8. The method of claim 1, wherein the counting of the number of memory cells having the threshold voltage which is greater than or equal to the program verify voltage, from among the memory cells connected to the selected word line, is performed after the program verify operation is completed, and
   wherein the voltage revision value is added to an $(N+1)^{th}$ preset program voltage of an $N+1^{th}$ program loop.

9. The method of claim 1, wherein the counting of the number of memory cells having the threshold voltage which is greater than or equal to the program verify voltage, from among the memory cells connected to the selected word line, is simultaneously performed with respect to an $N+1^{th}$ program loop that is executed after the $N^{th}$ program loop, and the voltage revision value is added to an $(N+2)^{th}$ preset program voltage of an $N+2^{th}$ program loop.

10. A method of programming a three-dimensional (3D) memory device comprising a plurality of memory cell groups comprising a first memory cell group and a second memory cell group each connected to a first selected word line, the method comprising:
   executing an $N^{th}$ program loop of a program operation by applying an $N^{th}$ program voltage to the first memory cell group connected to the first selected word line, and performing a program verify operation by applying a program verify voltage to the first memory cell group connected to the first selected word line;

counting a number of memory cells having a threshold voltage which is greater than or equal to the program verify voltage, from among memory cells included in the first memory cell group connected to the first selected word line;

generating a voltage revision value based on a result of the counting and an operational condition of the $N^{th}$ program loop; and adding the voltage revision value to an $M^{th}$ preset program voltage of an $M^{th}$ program loop executed after the $N^{th}$ program loop.

11. The method of claim 10, further comprising:
executing a plurality of program loops, including the $N^{th}$ program loop, with respect to the first memory cell group connected to the first selected word line, and generating a plurality of voltage revision values of the first memory cell group respectively corresponding to the plurality of program loops.

12. The method of claim 11, further comprising:
generating a revision value of the first memory cell group from the plurality of voltage revision values of the first memory cell group; and executing the plurality of program loops with respect to the second memory cell group connected to the first selected word line, by adding the revision value of the first memory cell group to each of a plurality of preset program voltages for executing the plurality of program loops with respect to the second memory cell group connected to the first selected word line.

13. The method of claim 12, wherein the generating of the revision value of the first memory cell group comprises generating the revision value of the first memory cell group from an average value of the plurality of voltage revision values of the first memory cell group or generating the revision value of the first memory cell group from a voltage revision value added to a program voltage of a last program loop of the plurality of program loops executed in the first memory cell group connected to the first selected word line.

14. The method of claim 12, wherein the memory device further includes a first memory cell group connected to a second selected word line adjacent to the first selected word line, and
the method further comprising:
generating a revision value of the second memory cell group which is connected to the first selected word line;
generating a revision value of the first selected word line from the revision values of the first and second memory cell groups connected to the first selected word line; and
executing the plurality of program loops with respect to the first memory cell group connected to the second selected word line by adding the revision value of the first selected word line to each of a plurality of preset program voltages for executing the plurality of program loops with respect to the first memory cell group of the second selected word line.

15. The method of claim 14, wherein the revision value of the first selected word line is generated by adding the revision values of the first and second memory cell groups of the first selected word line.

16. A method, comprising:
executing one program loop of a program operation for a group of memory cells of a memory device, by:
applying a program voltage to the memory cells, and
performing a program verify operation by applying a program verify voltage to the memory cells;
subsequent to executing the one program loop of the program operation, counting a number of memory cells, among the group of memory cells, which have a threshold voltage which is greater than or equal to the program verify voltage;
generating a voltage revision value based at least in part on a result of the counting;
adding the voltage revision value to a preset program voltage for an other program loop to produce an adjusted program voltage; and
executing the other program loop of the program operation for the group of memory cells of the memory device by applying the adjusted program voltage to the memory cells.

17. The method of claim 16, wherein the other program loop is a program loop immediately following the one program loop.

18. The method of claim 16, wherein the other program is a program loop which is two greater than the one program loop.

19. The method of claim 16, wherein executing the other program loop of the program operation for the group of memory cells of the memory device includes performing a program verify operation by applying a program verify voltage for the other program loop to the memory cells, the method further comprising:
subsequent to executing the other program loop of the program operation, counting another time the number of memory cells, among the group of memory cells, which have the threshold voltage which is greater than or equal to the program verify voltage;
generating an other voltage revision value based at least in part on a result of the counting the other time; and
adding the other voltage revision value to a preset program voltage for an additional program loop to produce an additional adjusted program voltage.

20. The method of claim 16, generating the voltage revision value based at least in part on a result of the counting includes selecting and referring to one of a plurality of look-up tables comprising table information that relates the result of the counting to the voltage revision value.

* * * * *